US010879252B2

(12) United States Patent
Xing et al.

(10) Patent No.: US 10,879,252 B2
(45) Date of Patent: Dec. 29, 2020

(54) NON-VOLATILE MEMORY CELLS WITH FLOATING GATES IN DEDICATED TRENCHES

(71) Applicant: Silicon Storage Technology, Inc., San Jose, CA (US)

(72) Inventors: Leo Xing, Shanghai (CN); Andy Liu, Shanghai (CN); Xian Liu, Sunnyvale, CA (US); Chunming Wang, Shanghai (CN); Melvin Diao, Shanghai (CN); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 16/208,072

(22) Filed: Dec. 3, 2018

(65) Prior Publication Data
US 2019/0214397 A1    Jul. 11, 2019

(30) Foreign Application Priority Data

Jan. 5, 2018  (CN) .......................... 2018 1 0013633

(51) Int. Cl.
| | |
|---|---|
| *H01L 29/423* | (2006.01) |
| *H01L 27/11521* | (2017.01) |
| *H01L 23/532* | (2006.01) |
| *H01L 29/08* | (2006.01) |
| *H01L 29/10* | (2006.01) |
| *H01L 29/66* | (2006.01) |
| *H01L 27/11524* | (2017.01) |

(Continued)

(52) U.S. Cl.
CPC .. *H01L 27/11521* (2013.01); *H01L 23/53295* (2013.01); *H01L 27/11524* (2013.01); *H01L 29/0847* (2013.01); *H01L 29/1037* (2013.01); *H01L 29/40114* (2019.08); *H01L 29/42328* (2013.01); *H01L 29/42336* (2013.01); *H01L 29/66825* (2013.01); *H01L 29/7881* (2013.01)

(58) Field of Classification Search
CPC ......... H01L 27/11521; H01L 27/11524; H01L 23/53295; H01L 29/40114; H01L 29/0847; H01L 29/1037; H01L 29/42328; H01L 29/42336; H01L 29/66825; H01L 29/7881

See application file for complete search history.

(56) References Cited

U.S. PATENT DOCUMENTS

| | | |
|---|---|---|
| 5,029,130 A | 7/1991 | Yeh |
| 6,747,310 B2 | 6/2004 | Fan et al. |

(Continued)

*Primary Examiner* — Mark W Tornow
(74) *Attorney, Agent, or Firm* — DLA Piper LLP (US)

(57) ABSTRACT

A pair of memory cells that includes first and second spaced apart trenches formed into the upper surface of a semiconductor substrate, and first and second floating gates disposed in the first and second trenches. First and second word line gates disposed over and insulated from a portion of the upper surface that is adjacent to the first and second floating gates respectively. A source region is formed in the substrate laterally between the first and second floating gates. First and second channel regions extend from the source region, under the first and second trenches respectively, along side walls of the first and second trenches respectively, and along portions of the upper surface disposed under the first and second word line gates respectively. The first and second trenches only contain the first and second floating gates and insulation material respectively.

25 Claims, 47 Drawing Sheets

(51) Int. Cl.
*H01L 21/28* (2006.01)
*H01L 29/788* (2006.01)

(56) References Cited

U.S. PATENT DOCUMENTS

| | | | |
|---|---|---|---|
| 6,855,980 B2 | 2/2005 | Wang et al. | |
| 6,894,343 B2* | 5/2005 | Harari | H01L 27/115 |
| | | | 257/314 |
| 6,906,379 B2* | 6/2005 | Chen | H01L 27/115 |
| | | | 257/315 |
| 6,952,034 B2 | 10/2005 | Hu et al. | |
| 7,151,021 B2 | 12/2006 | Chen et al. | |
| 7,315,056 B2 | 1/2008 | Klinger | |
| 7,868,375 B2 | 1/2011 | Liu et al. | |
| 8,148,768 B2 | 4/2012 | Do et al. | |
| 8,711,636 B2 | 4/2014 | Do et al. | |
| 9,917,165 B2* | 3/2018 | Wu | H01L 29/42328 |
| 10,170,488 B1 | 1/2019 | Shu et al. | |
| 2009/0014773 A1 | 1/2009 | Hsiao et al. | |
| 2009/0166708 A1* | 7/2009 | Io | H01L 27/0207 |
| | | | 257/319 |
| 2009/0207662 A1* | 8/2009 | Wang | H01L 27/11521 |
| | | | 365/185.18 |
| 2010/0127308 A1* | 5/2010 | Do | H01L 27/11519 |
| | | | 257/204 |
| 2011/0316068 A1 | 12/2011 | Abbott | |
| 2015/0035040 A1* | 2/2015 | Yoo | H01L 29/7881 |
| | | | 257/320 |
| 2015/0372121 A1* | 12/2015 | Chen | H01L 29/66825 |
| | | | 257/320 |
| 2017/0117285 A1 | 4/2017 | Chen et al. | |
| 2017/0330949 A1 | 11/2017 | Wang et al. | |

* cited by examiner

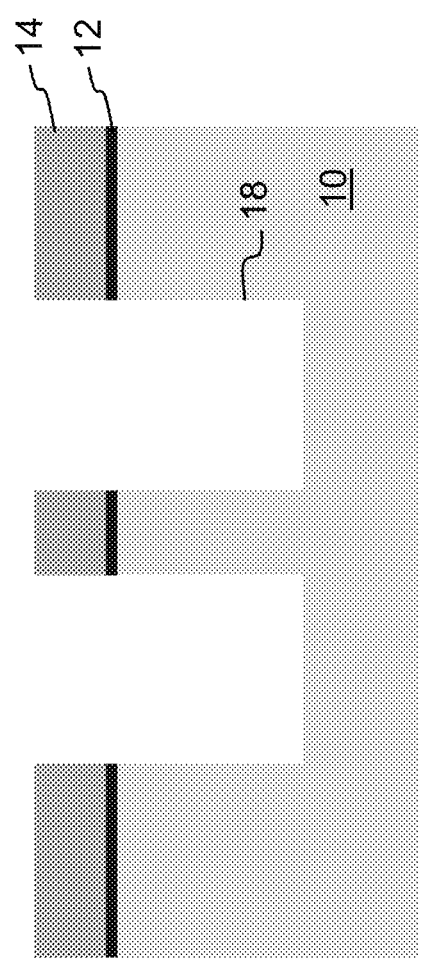

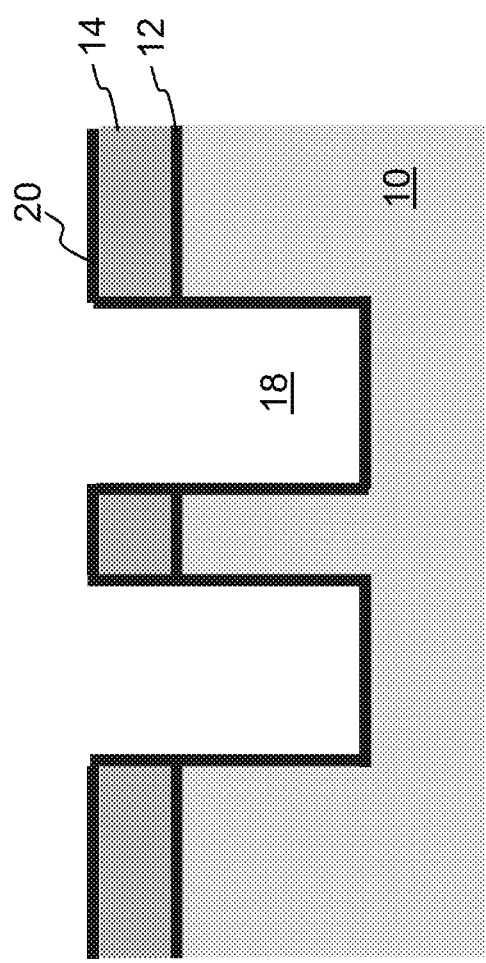

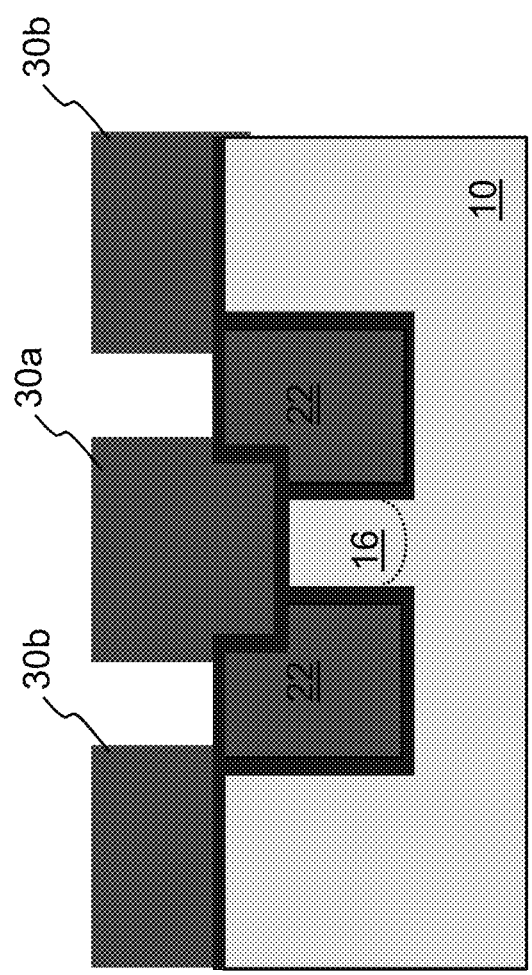

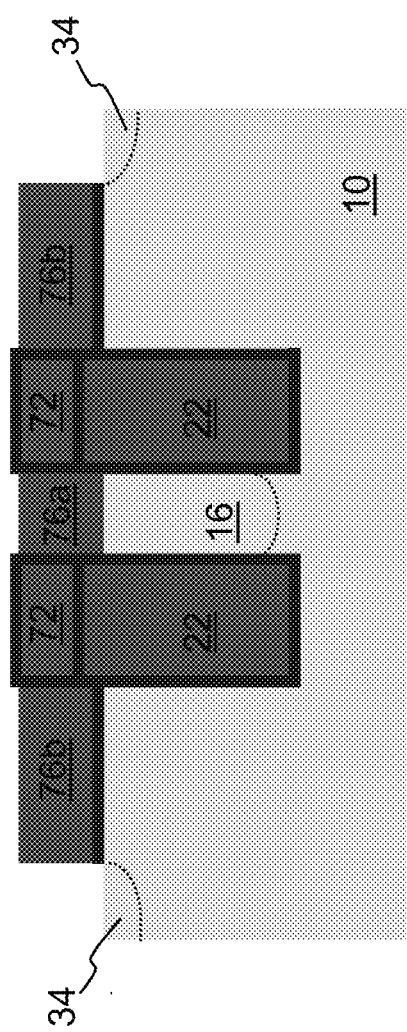

NON-VOLATILE MEMORY CELLS WITH FLOATING GATES IN DEDICATED TRENCHES

RELATED APPLICATION

This application claims the benefit of Chinese Patent Application No. 201810013633.4 filed on Jan. 5, 2018.

FIELD OF INVENTION

The present invention relates to non-volatile memory devices.

BACKGROUND OF THE INVENTION

Currently, non-volatile memory devices formed on the planar surface of a semiconductor substrate are well known. See for example U.S. Pat. Nos. 5,029,130, 6,747,310, 6,855,980, 7,315,056, 7,868,375 and 8,711,636. Each of these patents discloses a split gate non-volatile memory cell, where the source and drain regions are formed at the surface of the substrate, so that the channel region extending between the source and drain regions extends along the surface of the substrate. The conductivity of the channel region is controlled by a floating gate and a second gate (e.g. a word line gate) disposed over and insulated from the channel region of the substrate.

In an effort to increase the number of memory cells that can be formed in a given area of the substrate surface, trenches can be formed into the surface of the substrate, where a pair of memory cells are formed inside the trench. See for example, U.S. Pat. Nos. 6,952,034, 7,151,021 and 8,148,768. With these configurations, the source region is formed underneath the trench, whereby the channel region extends along the sidewall of the trench and the surface of the substrate (i.e. the channel region is not linear). By burying a pair of floating gates in each trench, the overall size of the memory cells as a function of substrate surface area space is reduced. Also, by burying two floating gates in each trench, pairs of memory cells sharing each trench also meant a reduction in surface area space occupied by each pair of memory cells.

There is a need to further reduce the size of pairs of memory cells as a function of substrate surface area space, so that more memory cells can be formed in any give surface area unit of the substrate.

BRIEF SUMMARY OF THE INVENTION

The aforementioned problems and needs are addressed with a pair of memory cells that includes a semiconductor substrate having an upper surface, first and second trenches formed into the upper surface and spaced apart from each other, a first floating gate of conductive material disposed in the first trench and insulated from the substrate, a second floating gate of conductive material disposed in the second trench and insulated from the substrate, an erase gate of conductive material having a first portion extending into the upper surface, and disposed laterally between and insulated from the first and second floating gates, a first word line gate of conductive material disposed over and insulated from a portion of the upper surface that is adjacent to the first floating gate, a second word line gate of conductive material disposed over and insulated from a portion of the upper surface that is adjacent to the second floating gate, a source region formed in the substrate laterally between the first and second floating gates and vertically under the first portion of the erase gate, a first drain region formed in a portion of the upper surface adjacent to the first word line gate, and a second drain region formed in a portion of the upper surface adjacent to the second word line gate. A first channel region of the substrate extends from the source region to the first drain region, including extending at least under the first trench, along a side wall of the first trench, and along a portion of the upper surface disposed under the first word line gate. A second channel region of the substrate extends from the source region to the second drain region, including extending at least under the second trench, along a side wall of the second trench, and along a portion of the upper surface disposed under the second word line gate.

A pair of memory cells includes a semiconductor substrate having an upper surface, first and second trenches formed into the upper surface and spaced apart from each other, a first floating gate of conductive material disposed in the first trench and insulated from the substrate, a second floating gate of conductive material disposed in the second trench and insulated from the substrate, a first word line gate of conductive material disposed over and insulated from a portion of the upper surface that is adjacent to the first floating gate, a second word line gate of conductive material disposed over and insulated from a portion of the upper surface that is adjacent to the second floating gate, a source region formed in the substrate laterally between the first and second floating gates, a first drain region formed in a portion of the upper surface adjacent to the first word line gate, and a second drain region formed in a portion of the upper surface adjacent to the second word line gate. A first channel region of the substrate extends from the source region to the first drain region, including extending at least under the first trench, along a side wall of the first trench, and along a portion of the upper surface disposed under the first word line gate. A second channel region of the substrate extends from the source region to the second drain region, including extending at least under the second trench, along a side wall of the second trench, and along a portion of the upper surface disposed under the second word line gate.

A method of forming a pair of memory cells includes forming spaced apart first and second trenches into an upper surface of a semiconductor substrate, forming a first floating gate of conductive material in the first trench and insulated from the substrate, forming a second floating gate of conductive material in the second trench and insulated from the substrate, forming an erase gate of conductive material having a first portion extending into the upper surface, and disposed laterally between and insulated from the first and second floating gates, forming a first word line gate of conductive material over and insulated from a portion of the upper surface that is adjacent to the first floating gate, forming a second word line gate of conductive material over and insulated from a portion of the upper surface that is adjacent to the second floating gate, forming a source region in the substrate laterally between the first and second floating gates and vertically under the first portion of the erase gate, forming a first drain region in a portion of the upper surface adjacent to the first word line gate, and forming a second drain region in a portion of the upper surface adjacent to the second word line gate. A first channel region of the substrate extends from the source region to the first drain region, including extending at least under the first trench, along a side wall of the first trench, and along a portion of the upper surface disposed under the first word line gate. A second channel region of the substrate extends from the source region to the second drain region, including extending at least under the second trench, along a side wall of the second trench, and along a portion of the upper surface disposed under the second word line gate.

A method of forming a pair of memory cells includes forming spaced apart first and second trenches into an upper surface of a semiconductor substrate, forming a first floating gate of conductive material in the first trench and insulated from the substrate, forming a second floating gate of conductive material in the second trench and insulated from the substrate, forming a first word line gate of conductive material over and insulated from a portion of the upper surface that is adjacent to the first floating gate, forming a second word line gate of conductive material over and insulated from a portion of the upper surface that is adjacent to the second floating gate, forming a source region in the substrate laterally between the first and second floating gates, forming a first drain region in a portion of the upper surface adjacent to the first word line gate, and forming a second drain region in a portion of the upper surface adjacent to the second word line gate. A first channel region of the substrate extends from the source region to the first drain region, including extending at least under the first trench, along a side wall of the first trench, and along a portion of the upper surface disposed under the first word line gate. A second channel region of the substrate extends from the source region to the second drain region, including extending at least under the second trench, along a side wall of the second trench, and along a portion of the upper surface disposed under the second word line gate.

Other objects and features of the present invention will become apparent by a review of the specification, claims and appended figures.

BRIEF DESCRIPTION OF THE DRAWINGS

FIGS. 1A-1L are side cross sectional views illustrating the steps in forming the memory cells of the present invention.

FIGS. 5A-5H are side cross sectional views illustrating the steps in forming the memory cells of a fifth embodiment of the present invention.

DETAILED DESCRIPTION OF THE INVENTION

The present invention is solves the above mentioned needs by forming two separate trenches into the surface of the substrate for each pair of memory cells, and forming a floating gate and only a floating gate in each trench. This technique also forms a controlled reduced size of the source region, as further explained below.

Figure 1A:
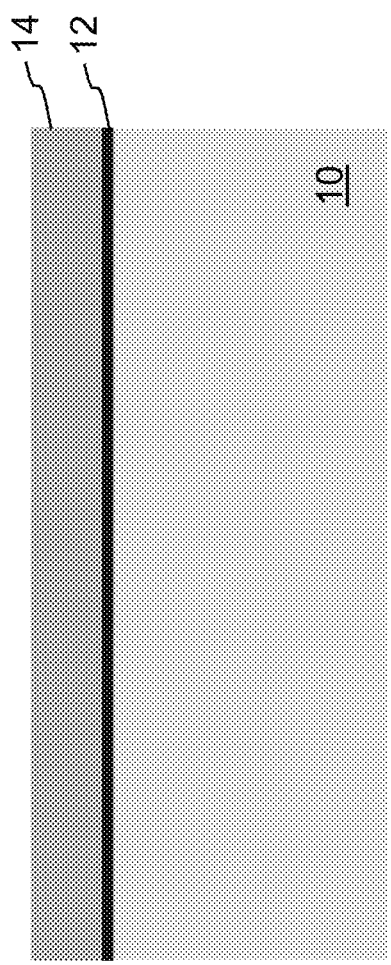

The formation of a pair of memory cells starts with a semiconductor substrate 10. While only one is shown and described, it should be understood that an array of such pairs of memory cells would be formed on the same substrate 10. An oxide layer 12 is formed on the substrate. A nitride layer 14 is formed on the oxide layer 12. The resulting structure is shown in FIG. 1A. A photolithography masking process is then formed to etch through the nitride layer 14, oxide layer 12 and into the substrate 10, forming a pair of trenches 18, with the source region 16 there between. The masking step includes forming a layer of photo resist on the nitride layer, and selectively exposing portions of the photo resist. Selected portions of the photo resist are removed, leaving portions of the nitride layer 14 exposed. One or more etches are performed to remove the exposed portions of the nitride 14, and the underlying portions of the oxide 12 and substrate 10. The resulting structure is shown in FIG. 1B (after removal of the photo resist). The trench etch defines the lateral width of the source region 16.

Figure 1D:
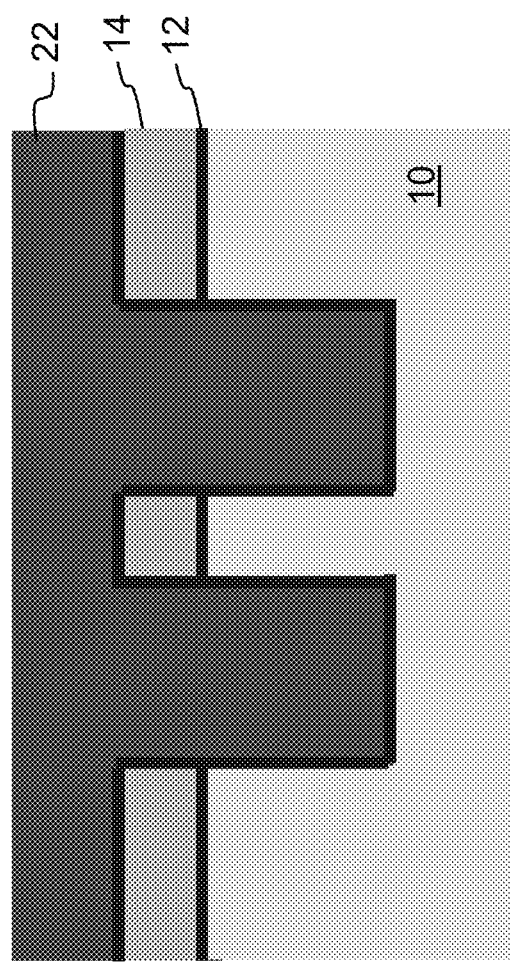
Figure 1E:
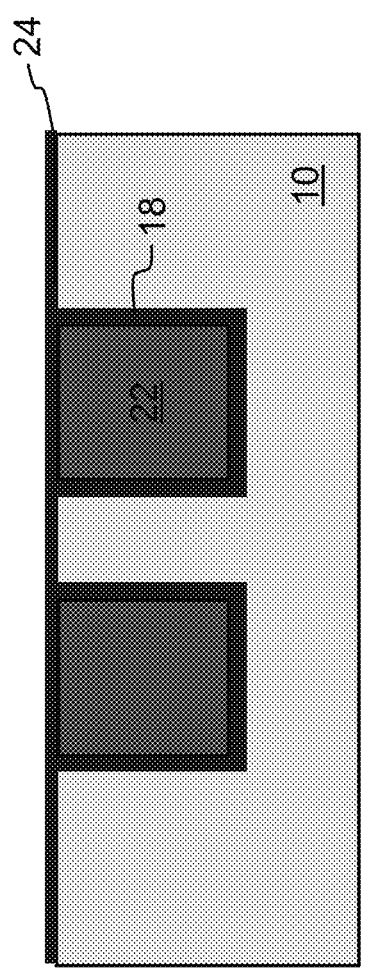

Tilt and vertical implant are performed to adjust the surface of the substrate that will be channel region under the floating gate. An oxide deposition step is performed to form a layer of oxide 20 on the exposed surfaces of the structure, including on the exposed surfaces of nitride layer 14 and the exposed surfaces of trenches 18, as shown in FIG. 1C. A layer of polysilicon 22 is then deposited over the structure, filling each trench 18 with polysilicon 22, as shown in FIG. 1D. The portions of polysilicon 22, nitride 14 and oxide 12 above the upper surface of the substrate 10 are removed (e.g., etch and chemical mechanical polish processes), leaving blocks of polysilicon 22 filling trenches 18 in the substrate 10. The upper surfaces of poly 22 can be even with the upper surface of the substrate, or the etch can stop short of the surface so that a portion of the poly 22 extends out of trenches 18 whereby the upper surfaces of poly 22 are disposed above the height of the substrate upper surface. A layer of oxide 24 is then formed on the exposed surfaces of substrate 10 and polysilicon blocks 22. The resulting structure is shown in FIG. 1E.

Figure 1F:
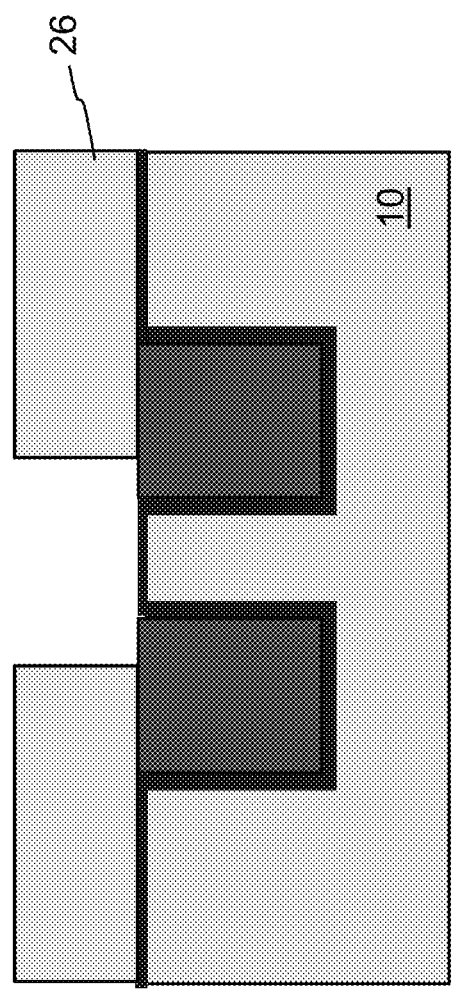
Figure 1G:
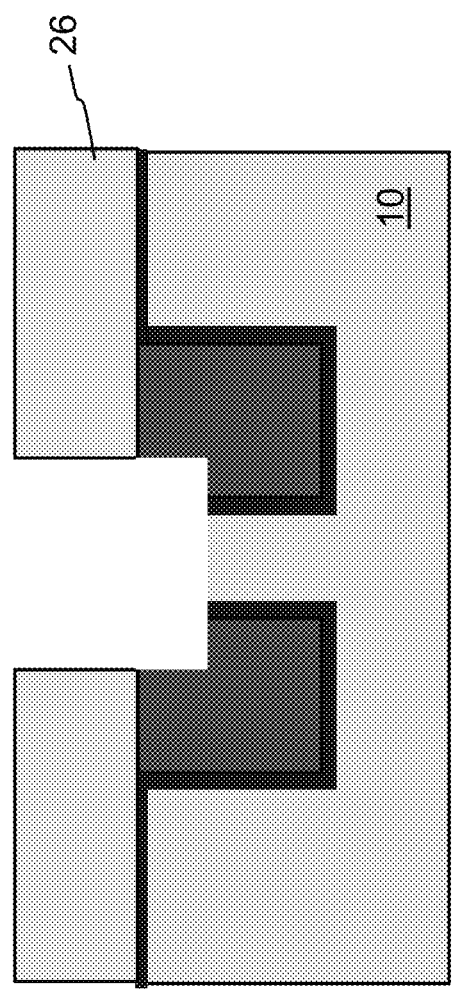
Figure 1H:
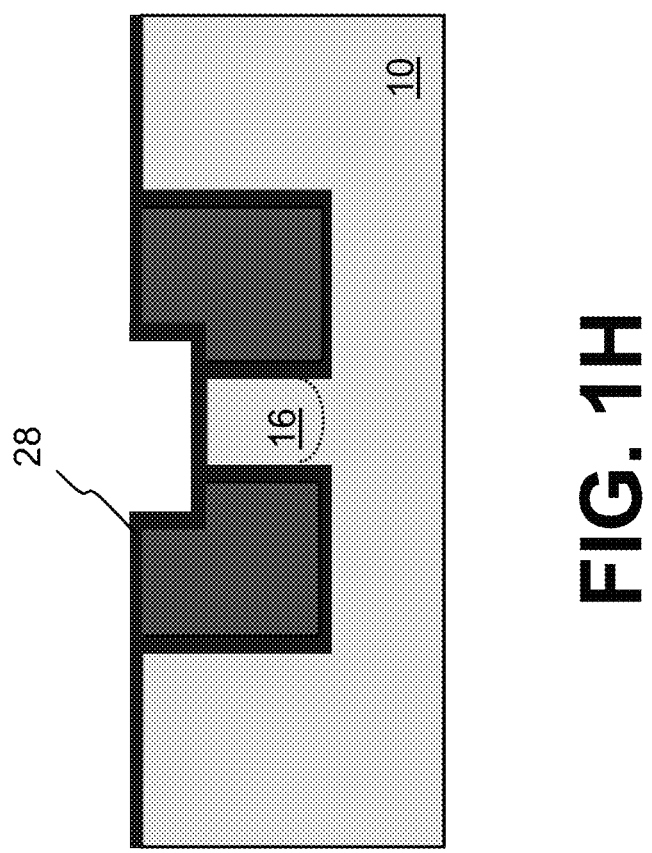

Another masking step is performed to form a layer of photo resist 26 over the structure, and removing that portion of photo resist 26 over the source region 16 between the trenches 18, as shown in FIG. 1F. An etch is then performed to remove oxide 24 and an upper portion of the substrate 10 between the trenches, as shown in FIG. 1G. An implantation is performed to form a source region 16 (i.e. a region having a second conductivity type different than the first conductivity type of the substrate) in the substrate between the trenches 18. After the photo resist 26 is removed, the exposed oxide 24 is preferably removed. An oxide layer 28 is then formed over the structure, including along the exposed portions of the sidewall, and the top surface, of poly blocks 22, as shown in FIG. 1H. This oxide will serve as the tunnel oxide for the memory cells.

Figure 1I:
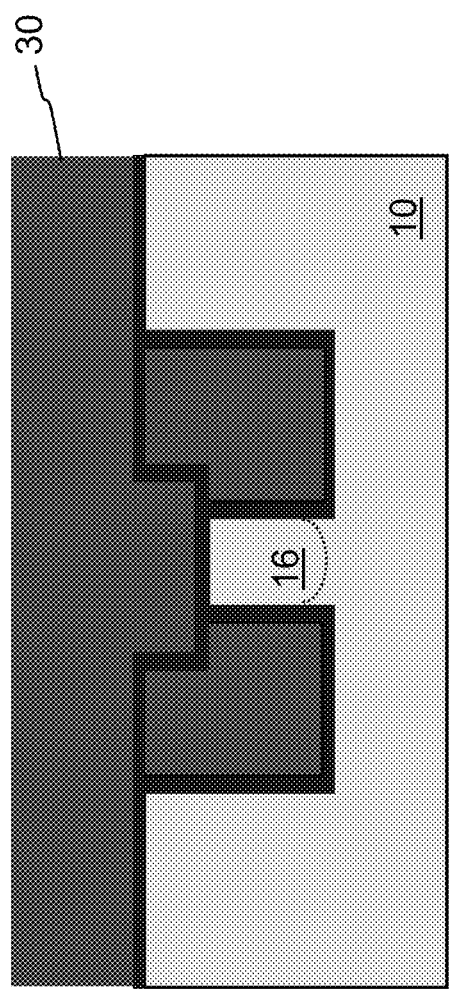
Figure 1J:
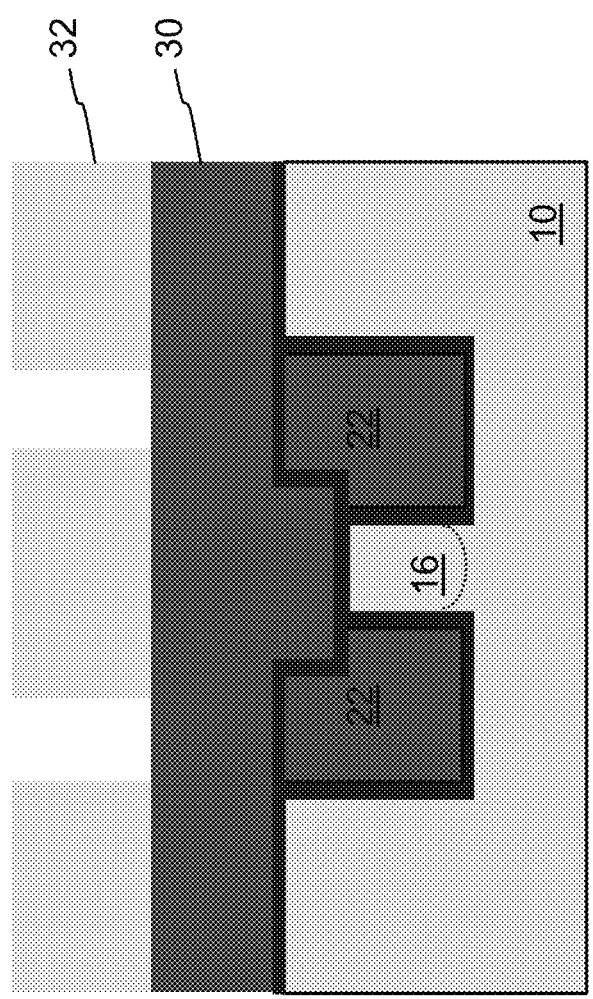

A polysilicon layer 30 is deposited over the structure, as shown in FIG. 1I. A masking step is performed to form a layer of photo resist 32 on poly layer 30, and removing portions of the photoresist 32 disposed over the poly blocks 22 and portions spaced away from poly blocks 22, exposing portions of poly layer 30 underneath, as shown in FIG. 1J. A poly etch is then performed to remove the exposed portions of poly layer 30, leaving a block 30a of poly 30 between poly blocks 22, and blocks 30b of poly 30 to the outside of poly blocks 22, as shown in FIG. 1K (after removal of photo resist 32). An implant is performed to form drain regions 34 in the substrate near the outer side surfaces of poly blocks 30b. The final structure is shown in FIG. 1L.

Figure 1L:
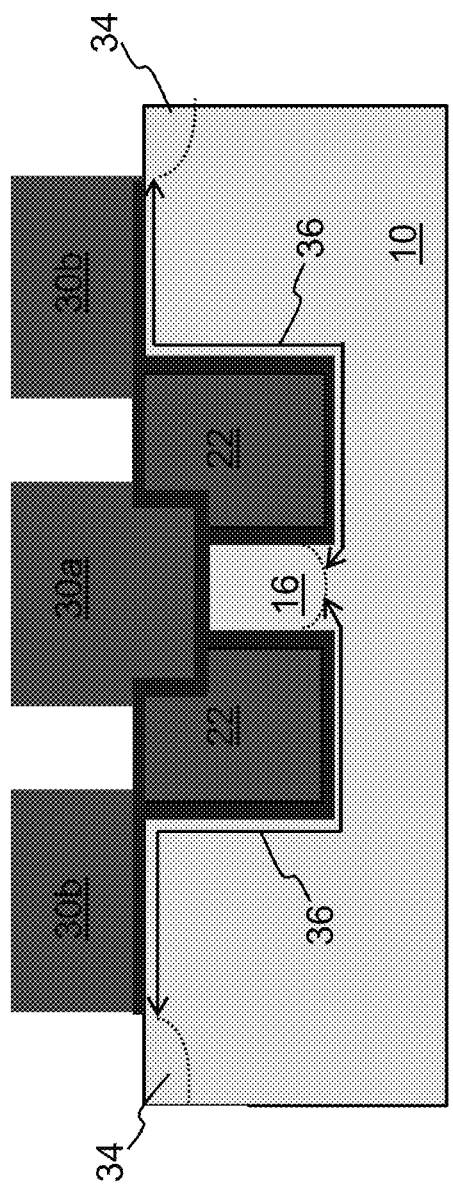

As shown in FIG. 1L, the pair of memory cells includes a pair of floating gates 22 in trenches 18 and insulated from the substrate. The upper surface of the floating gates is preferably even with the upper surface of substrate 10, but could extend above the height of the substrate upper surface if desired. An erase gate 30a is disposed over and insulated from source region 16. The erase gate 30a has a lower portion that extends into the surface of the substrate with lower corners that face and extent into notches formed in the upper surfaces of the floating gates (i.e., at the upper corner regions). The erase gate 30a has an upper portion that extends up above the level of the substrate surface and preferably over the floating gates. Each memory cell includes a word line gate 30b disposed over and insulated from the substrate upper surface. Each memory cell also includes a channel region 36 that extends from the source region 16, along the bottom of the trench 18, along a sidewall of the trench 18, and along the surface of the substrate to the drain region 34. The conductivity of the portions of the channel region along the trench are controlled by the floating gate. The conductivity of the portion of the channel region along the surface of the substrate 10 is controlled by the word line gate 30b. Programming of the floating gates is enhanced because the horizontal portion of the channel region is aimed at the floating gate, which enhances hot electron injection. Erase is enhanced because the erase gate includes lower corners that face and extend into notches formed in the upper surfaces of the floating gates, for better efficiency in Fowler-Nordheim tunneling of electrons from the floating gate to the erase gate. Finally, miniaturization of the memory cell pair is enhanced because the trenches not only define the lateral width of the source region 16 from both opposing sides, but also define the lateral dimensions of each floating gate from both opposing sides (because the each floating gate and the insulation layer 20 surrounding it completely fill the trench) and define the corresponding portions of the channel region.

Figure 2A:
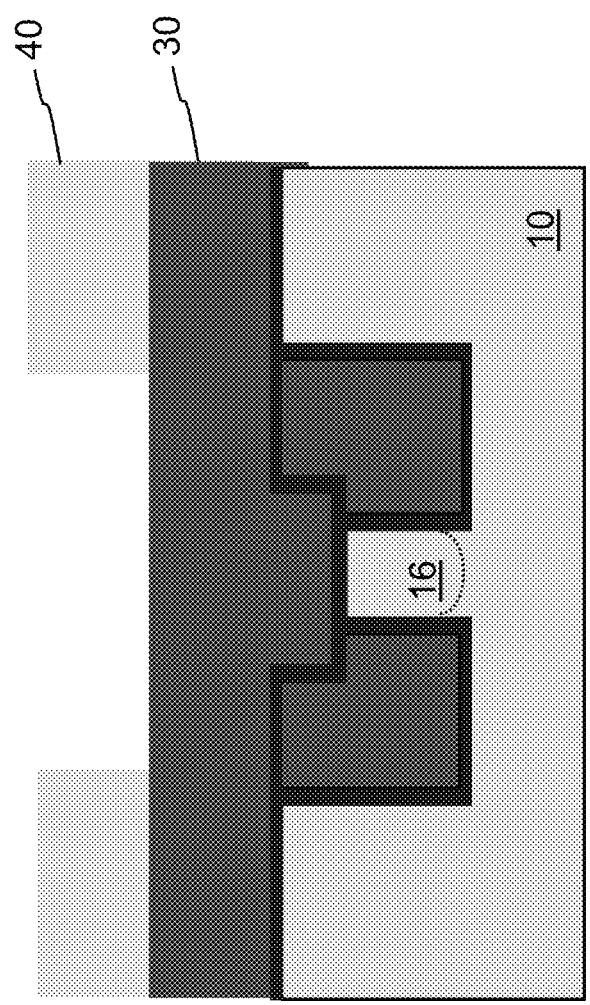
FIGS. 2A-2E are side cross sectional views illustrating the steps in forming the memory cells of a second embodiment of the present invention.
Figure 2B:
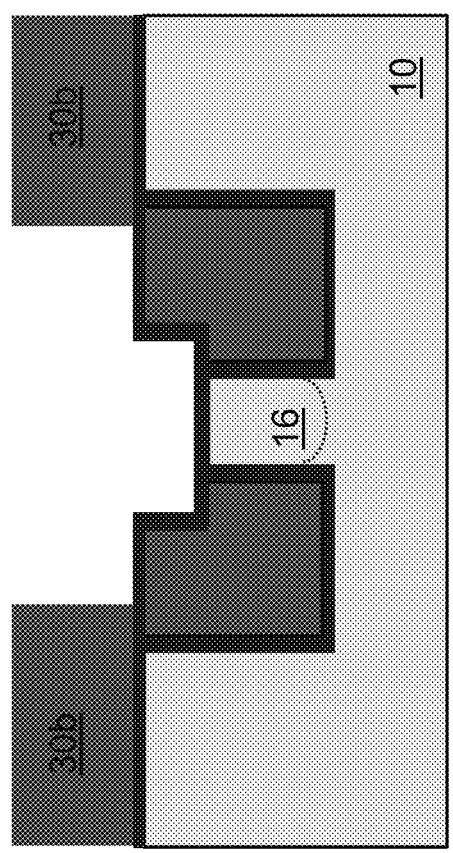
Figure 2C:
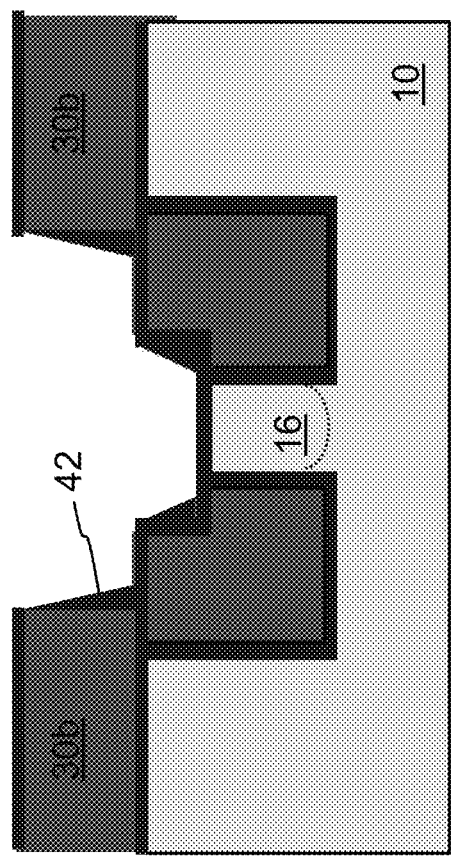
Figure 2D:
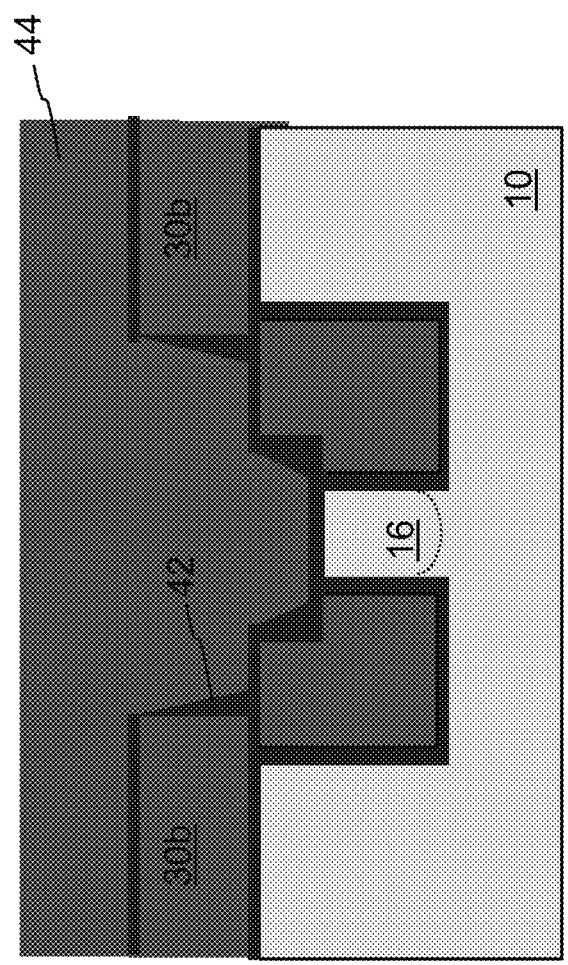
Figure 2E:
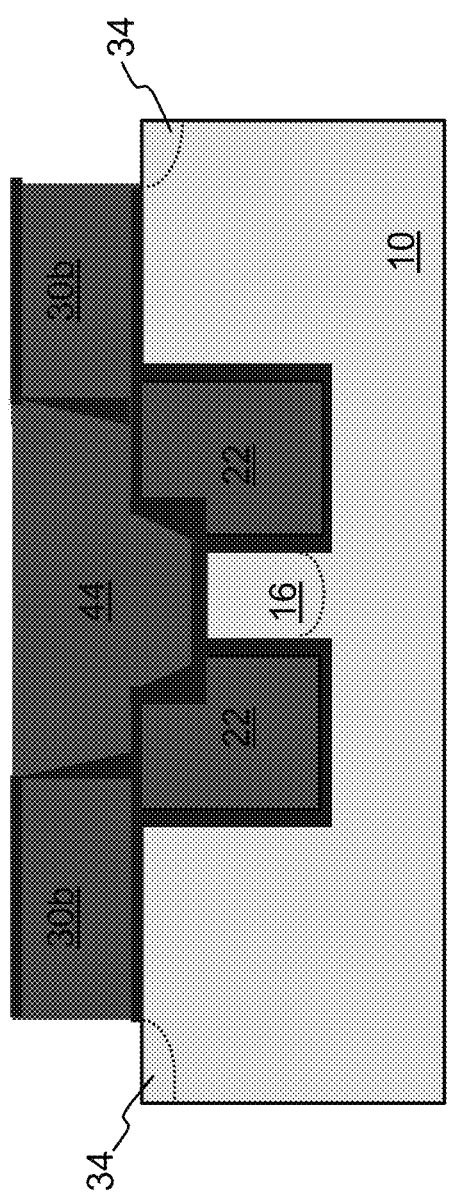

FIGS. 2A-2E illustrate the formation of another embodiment. The formation of this embodiment starts with the same structure shown in FIG. 1I. A masking step is performed to form a layer of photo resist 40 on poly layer 30, and removing the portion of the photoresist disposed over and between the floating gates 22, exposing of poly layer 30 underneath, as shown in FIG. 2A. A poly etch is then performed to remove the exposed portion of poly layer 30, leaving word line gates 30b, as shown in FIG. 2B (after removal of photo resist 40). An oxide layer 42 is formed over the structure (which could include removing the existing exposed oxide layer(s) first), as shown in FIG. 2C. A layer of polysilicon 44 is then formed over the structure, as shown in FIG. 2D. The upper portion of poly 44 is then removed (e.g., using CMP), leaving behind a poly block 44 between the word line gates 30b. The drain regions 34 are then formed by implant, resulting in the final structure shown in FIG. 2E. Poly block 44 is the erase gate, with a lower portion laterally adjacent to portions of the floating gate and facing the notches in the upper floating gate corners, and an upper portion that extends up and over the floating gates.

Figure 3A:
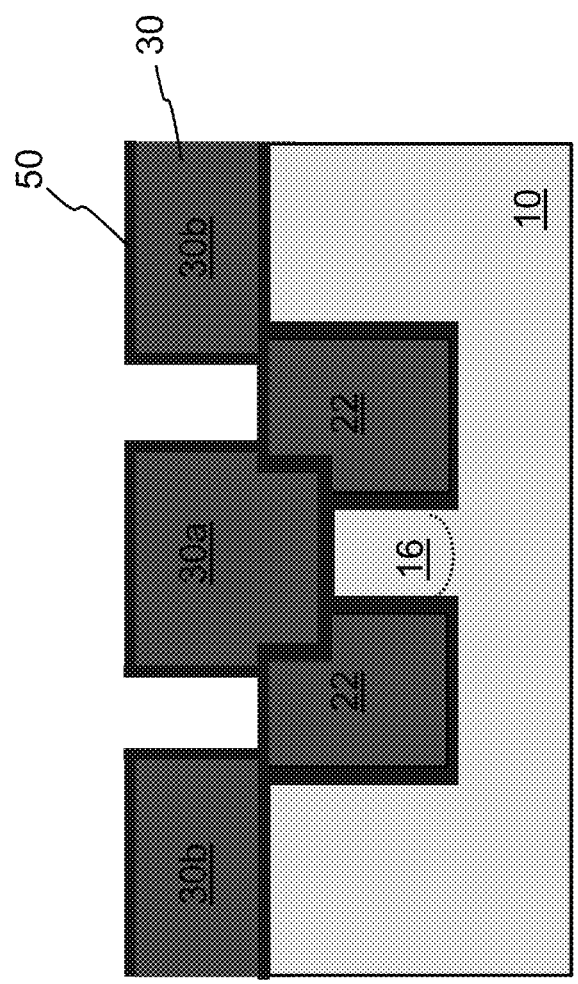
FIGS. 3A-3C are side cross sectional views illustrating the steps in forming the memory cells of a third embodiment of the present invention.
Figure 3B:
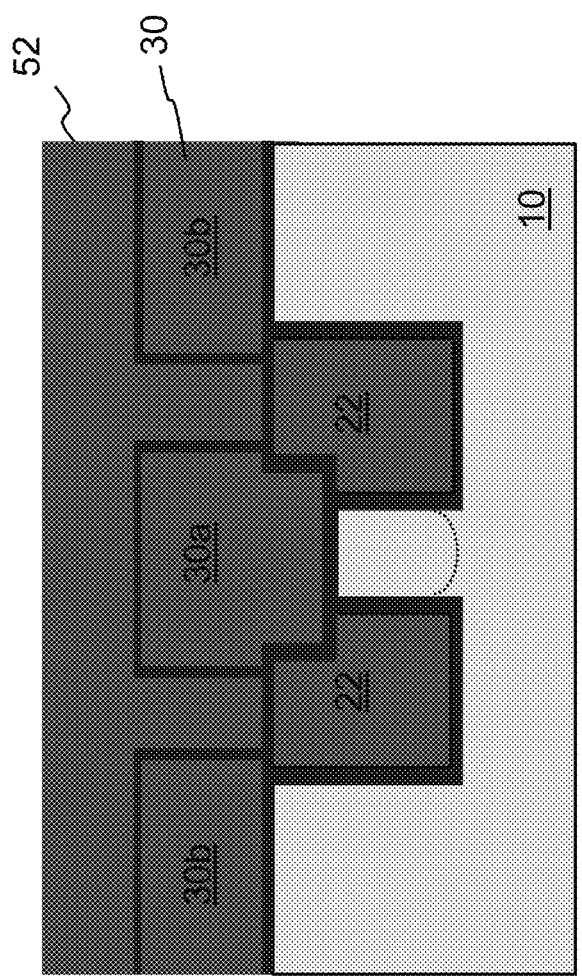
Figure 3C:
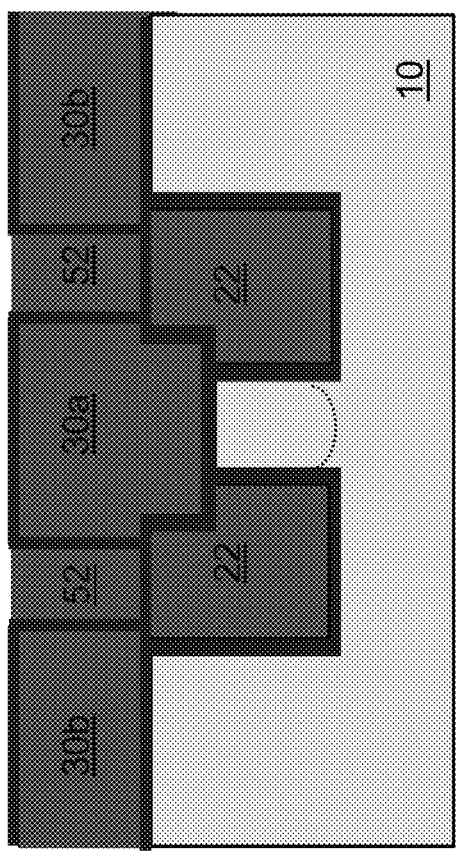

FIGS. 3A-3C illustrate the formation of another embodiment. The formation of this embodiment starts with the structure shown in FIG. 1L. An insulation layer (e.g., oxide) 50 is formed on the structure, including the exposed tops and side surfaces of erase gate 30a and word line gates 30b, as shown in FIG. 3A. Polysilicon 52 is then deposited over the structure, as shown in FIG. 3B. A poly etch is then performed to remove the top portions of poly 52, leaving poly blocks 52 each of which is disposed over and insulated from one of the floating gates 22, and is disposed between and insulated from the erase gate 30a and one of the word line gates 30b, as shown in FIG. 3C. The drain regions can be formed before or after the formation of the poly blocks 52. Poly blocks 52 constitute control gates that can be used to better enhance the operation of the memory cells though capacitive coupling to the floating gates.

Figure 4A:
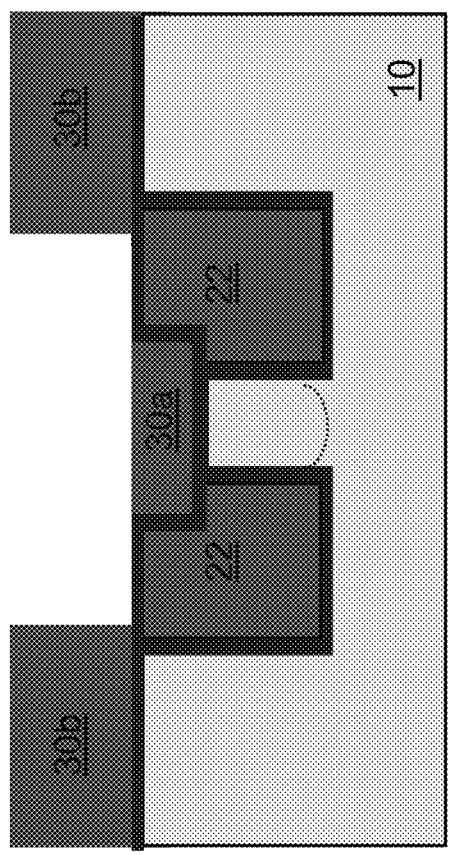
FIGS. 4A-4D are side cross sectional views illustrating the steps in forming the memory cells of a fourth embodiment of the present invention.
Figure 4B:
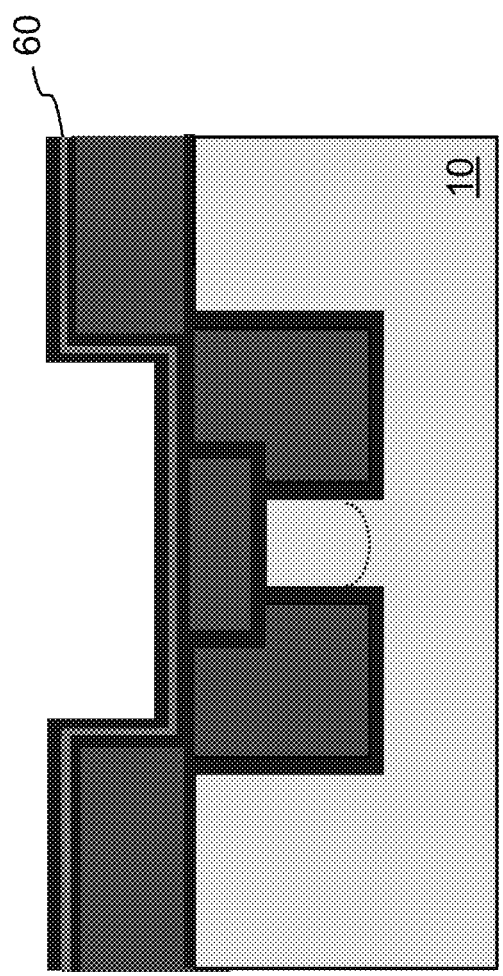
Figure 4C:
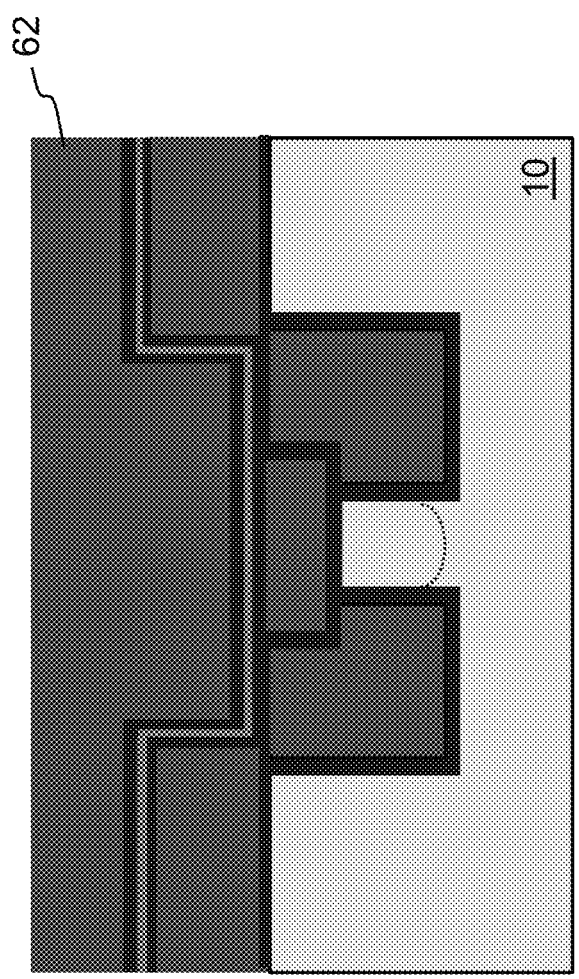
Figure 4D:
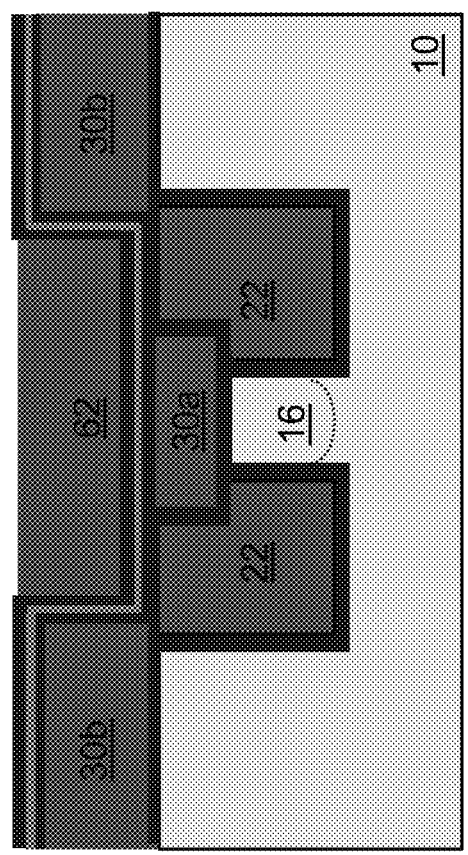

FIGS. 4A-4D illustrate the formation of another embodiment. The formation of this embodiment starts with the structure shown in FIG. 1L. A poly etch is used to remove the upper portion of the erase gate 30a (using a photolithography process), as shown in FIG. 4A. The upper surface of the erase gate 30a can be even with, or extend higher than, the height of the substrate upper surface. Insulation layer 60 is then formed over the structure. This insulation layer can be a layer of single material, or could have multiple sub layers (e.g., ONO, which is oxide-nitride-oxide), as shown in FIG. 4B. Polysilicon 62 is then deposited over the structure, as shown in FIG. 4C. A poly etch is then performed to remove the top portions of poly 62, leaving poly block 62 disposed over and insulated from the floating gates 22 and erase gate 30a, and between and insulated from the word line gates 30b, as shown in FIG. 4D. Poly block 62 constitutes a control gate shared with both memory cells that can be used to better enhance the operation of the memory cells though capacitive coupling to the floating gates.

Figure 5A:
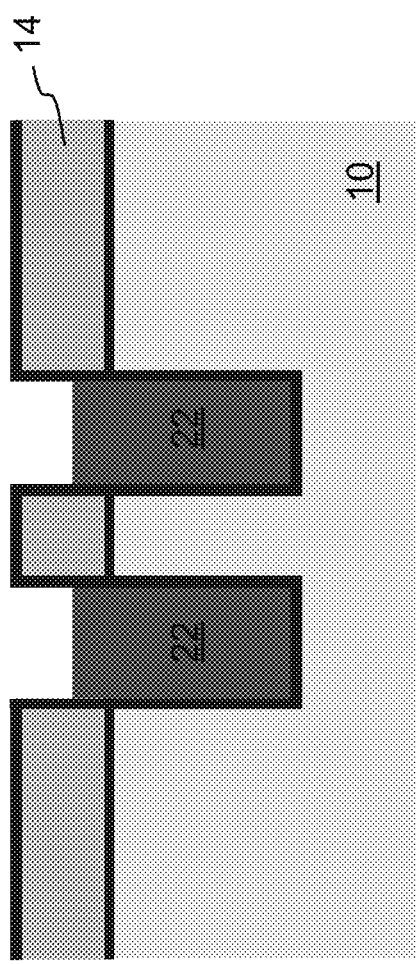
Figure 5B:
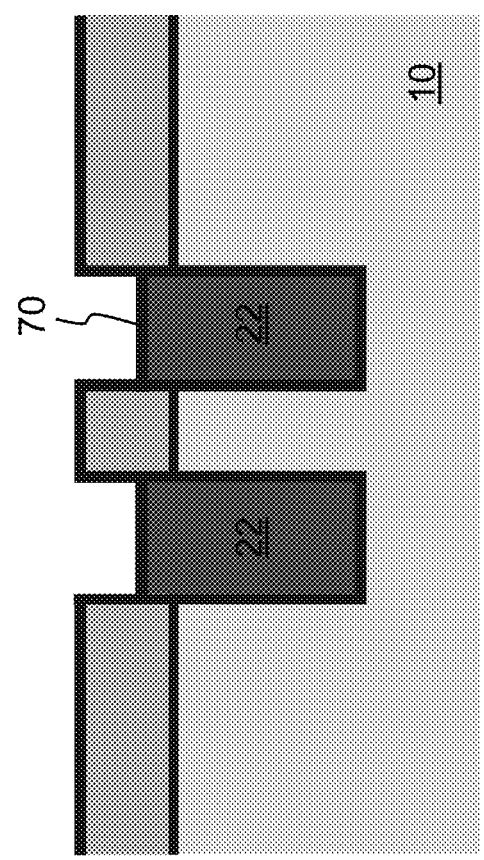
Figure 5C:
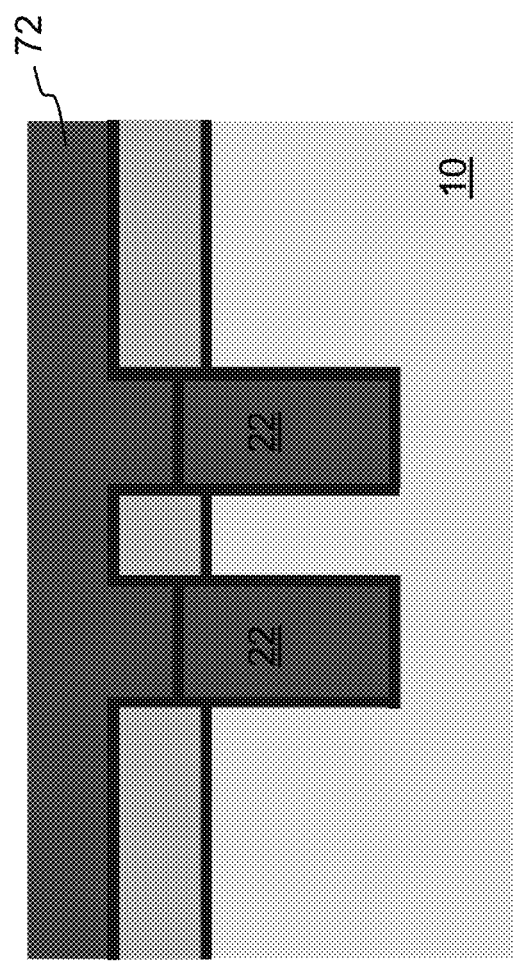
Figure 5D:
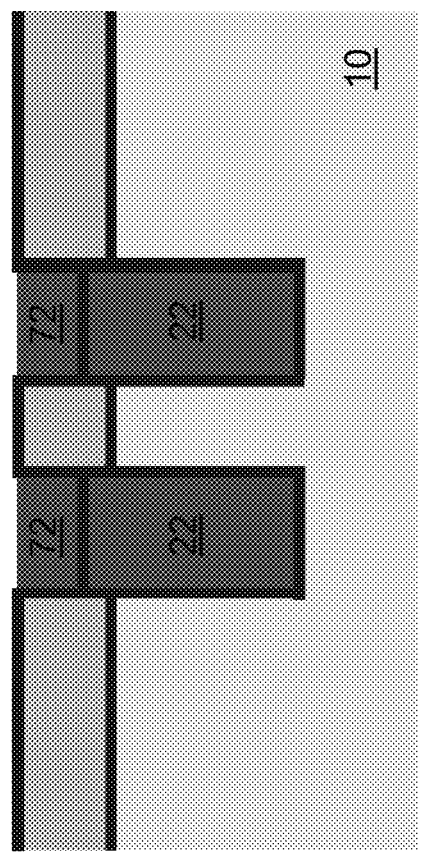
Figure 5E:
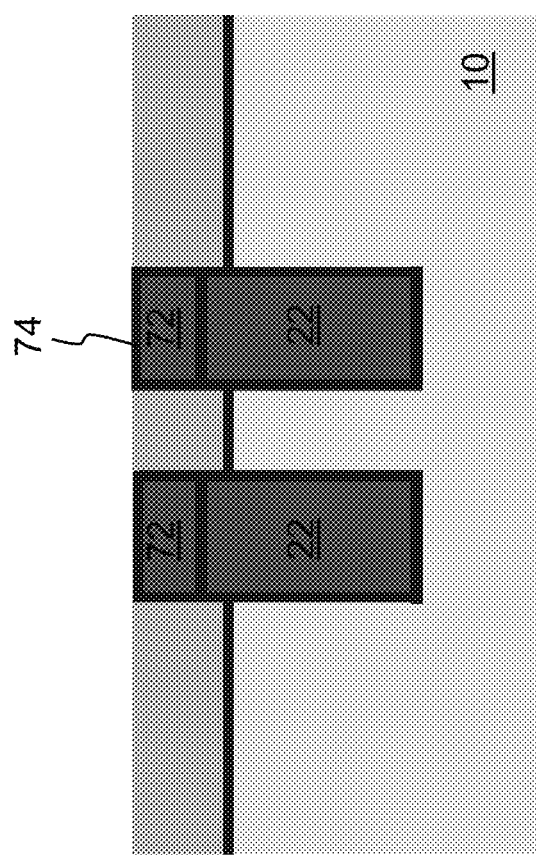
Figure 5F:
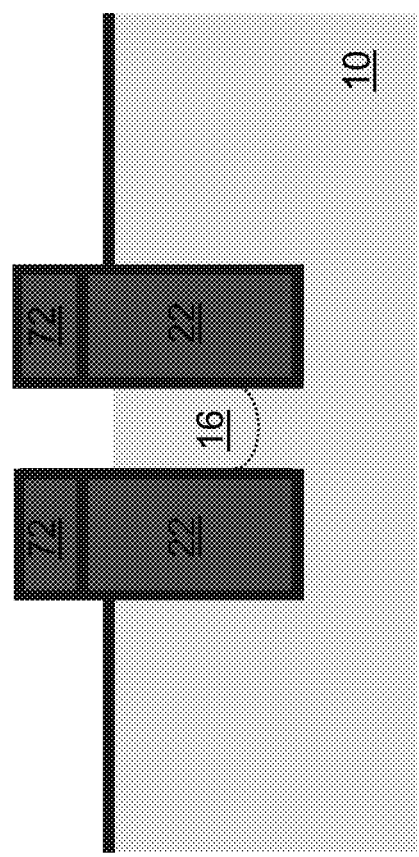
Figure 5G:
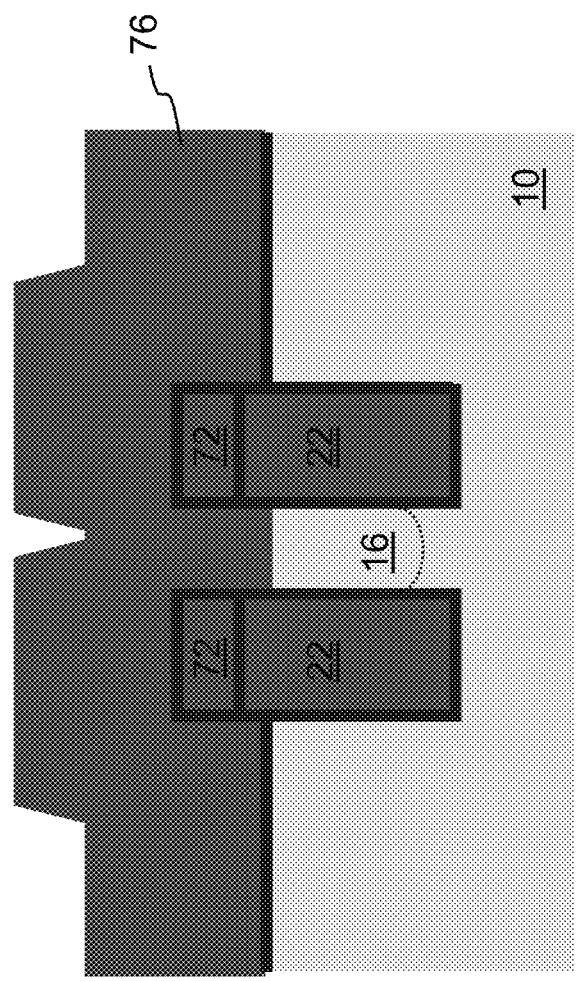

FIGS. 5A-5H illustrate the formation of another embodiment. The formation of this embodiment starts with the structure shown in FIG. 1C. A poly etch is used to remove the upper portion poly 22, and to recess the top surface of poly 22 so that it is between the top and bottom surfaces of nitride layer 14 (i.e., above the height of the substrate surface), as shown in FIG. 5A. A layer of insulation (e.g. oxide) 70 is formed on the exposed top surfaces of poly blocks 22. A poly deposition is then performed to form poly layer 72 over the structure, as shown in FIG. 5C. A poly etch or removal process is performed (e.g., CMP) to remove poly layer 72 except for portions thereof in trenches 18, and followed by poly etch back making the surface of the poly blocks 72 lower than the oxide 20, as shown in FIG. 5D. The poly blocks 72 are the erase gates. Oxide deposition is performed, and then oxide 20 is removed from the top surface of nitride 14 by oxide CMP, leaving oxide layer 74 on the top surfaces of erase gates 72, as shown in FIG. 5E. A nitride etch is used to remove nitride 14, and an oxide etch is used to remove that portion of oxide 12 on the substrate surface between the floating gates 22, as shown in FIG. 5F. A polysilicon deposition is performed to form poly layer 76 over the structure, as shown in FIG. 5G. A poly etch is performed to remove the upper portions of poly 76, leaving poly block 76a disposed on (and in electrical contact with) the substrate surface and between (and insulated from) the erase gates 72, and leaving poly blocks 76b to the outside of and insulated from the erase gates 72. An implant is then performed to form the drain regions 34. The final structure is shown in FIG. 5H. With this embodiment, the poly block 76a is in electrical contact with source region 16, and forms an extended source line for better conductivity. Poly blocks 76b are the word line gates.

Figure 6A:
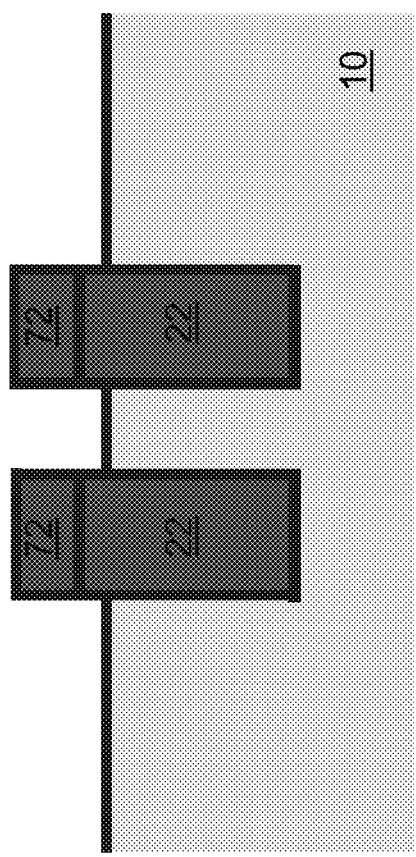
FIGS. 6A-6C are side cross sectional views illustrating the steps in forming the memory cells of a sixth embodiment of the present invention.
Figure 6B:
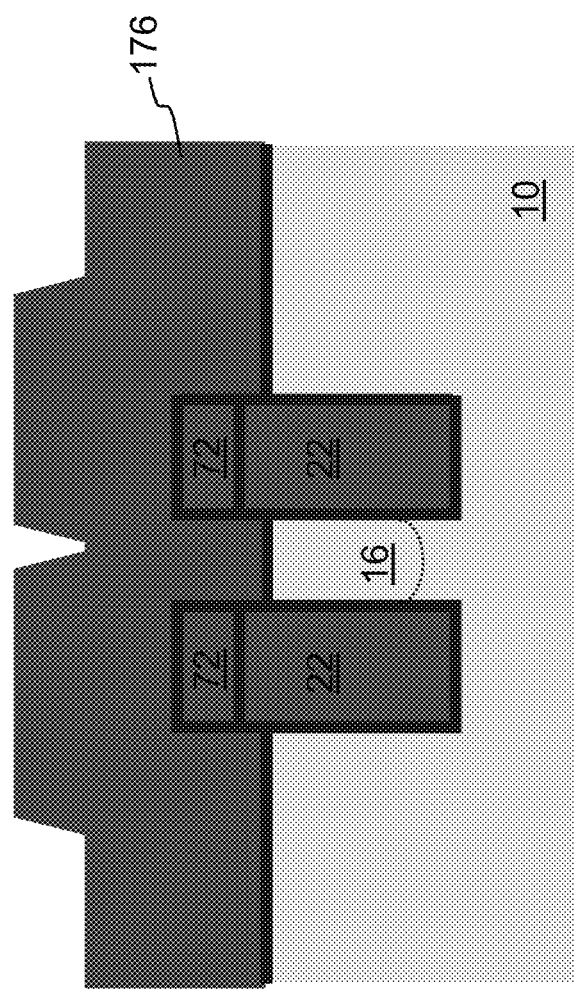
Figure 6C:
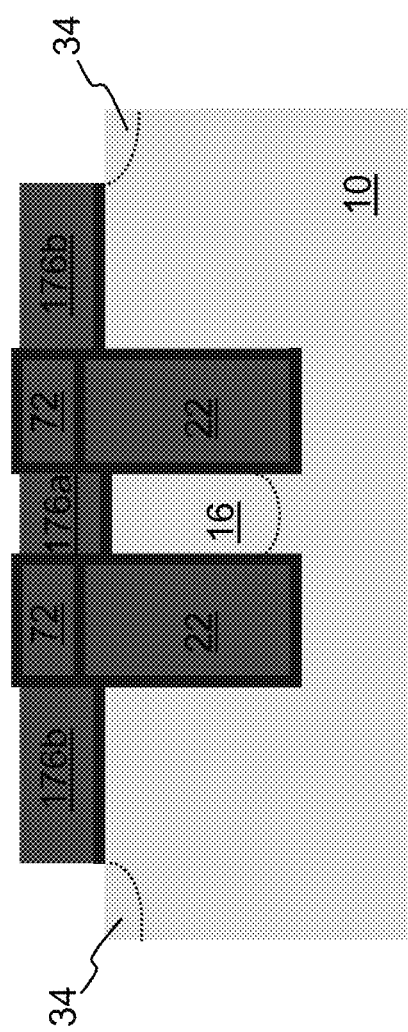

FIGS. 6A-6C illustrate the formation of another embodiment. The formation of this embodiment starts with the structure shown in FIG. 5E. The poly 72 in this embodiment will constitute the control gates. Nitride 14 is removed as shown in FIG. 6A. A masking step and implant are performed to form source region 16 in the substrate between poly blocks 22. A polysilicon deposition is performed to form poly layer 176 over the structure, as shown in FIG. 6B. A poly etch is performed to remove the upper portions of poly 176, leaving poly block 176a disposed over and insulated from the source region 16 of the substrate 10, and laterally between and insulated from poly blocks 72, and leaving poly blocks 176b laterally to the outside of and insulated from the poly blocks 72. An implant is then performed to form the drain regions 34. The final structure is shown in FIG. 6C. With this embodiment, the poly block 176a is erase gate, poly blocks 72 are the control gates, and poly blocks 176b are the word line gates.

Figure 7A:
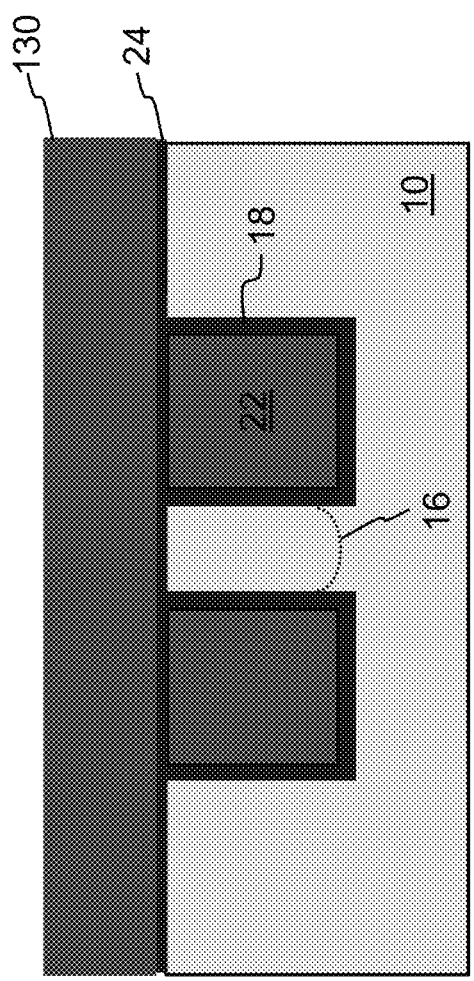
FIGS. 7A-7B are side cross sectional views illustrating the steps in forming the memory cells of a seventh embodiment of the present invention.
Figure 7B:
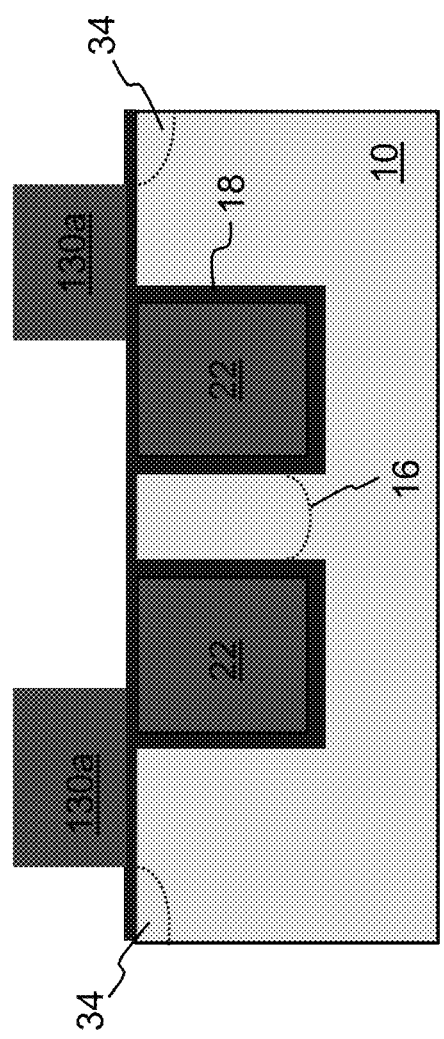

FIGS. 7A-7B illustrate the formation of another embodiment. The formation of this embodiment starts with the structure shown in FIG. 1E. A masking step and implant are performed to form source region 16 in the substrate between poly blocks 22. A polysilicon deposition is performed to form poly layer 130 over the structure, as shown in FIG. 7A. A masking step and poly etch are performed to remove portions of poly 30 over the source region 16 and over portions of the poly blocks 22, leaving poly blocks 130a as word line gates. An implant is then performed to form the drain regions 34. The final structure is shown in FIG. 7B. Here, each memory cell includes only two gates: floating gate 22 and word line gate 130a.

Figure 8A:
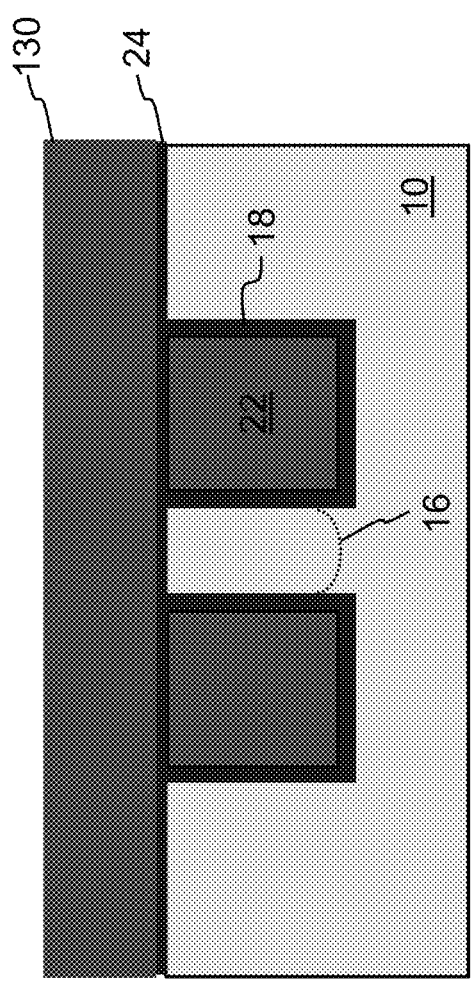
FIGS. 8A-8B are side cross sectional views illustrating the steps in forming the memory cells of a eighth embodiment of the present invention.
Figure 8B:
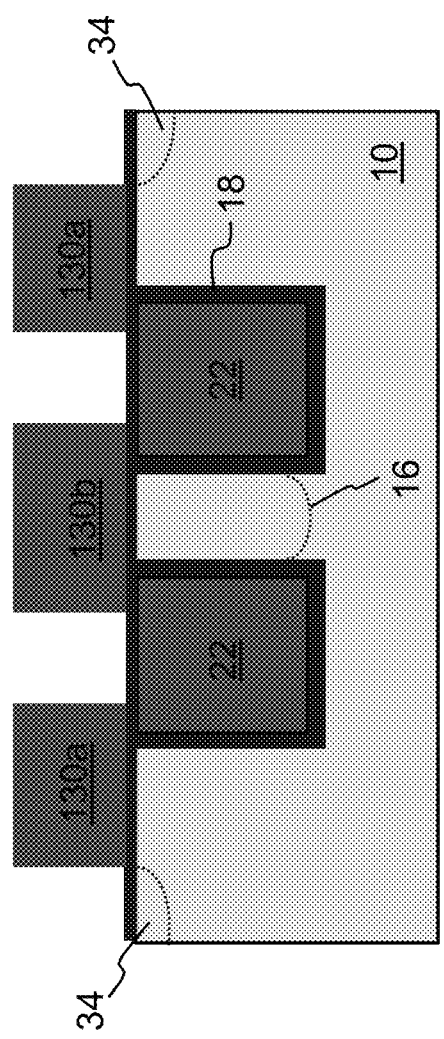

FIGS. 8A-8B illustrate the formation of another embodiment. The formation of this embodiment starts with the structure shown in FIG. 1E. A masking step and implant are performed to form source region 16 in the substrate between poly blocks 22. A polysilicon deposition is performed to form poly layer 130 over the structure, as shown in FIG. 8A. A poly etch is performed to remove portions of poly 130, leaving poly block 130a over and insulated from the source region 16, and poly blocks 130b over and insulated from the substrate. An implant is then performed to form the drain regions 34. The final structure is shown in FIG. 8B. Poly blocks 130a are the word line gates, and poly block 130b is the erase gate.

Figure 9A:
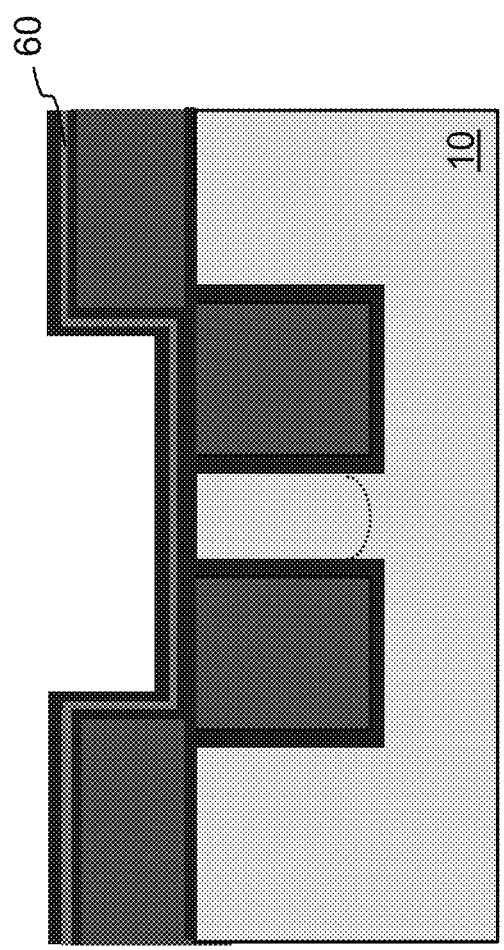
FIGS. 9A-9D are side cross sectional views illustrating the steps in forming the memory cells of a ninth embodiment of the present invention.
Figure 9B:
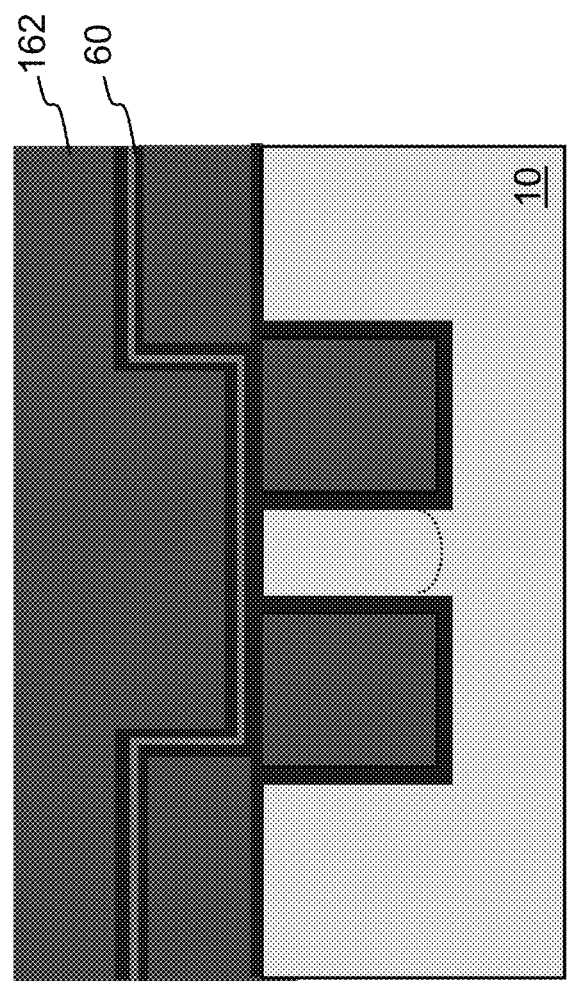
Figure 9C:
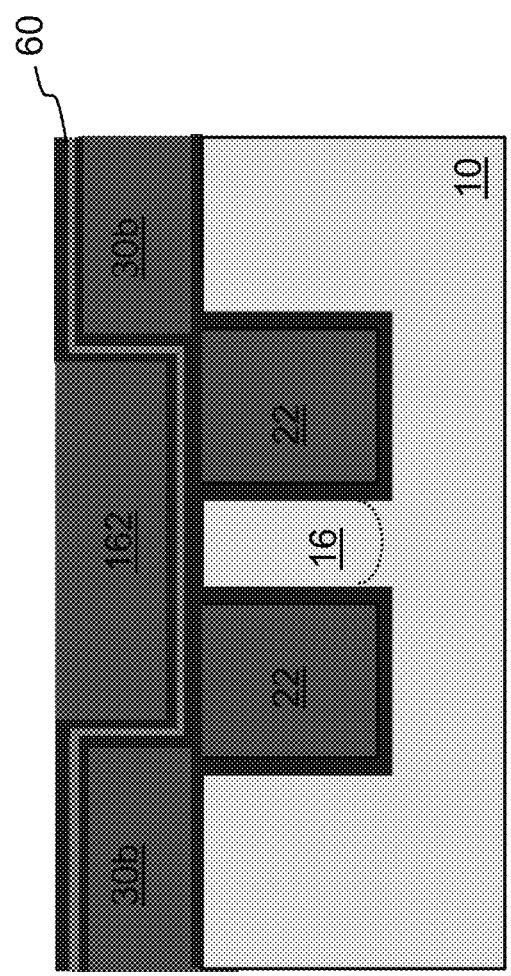
Figure 9D:
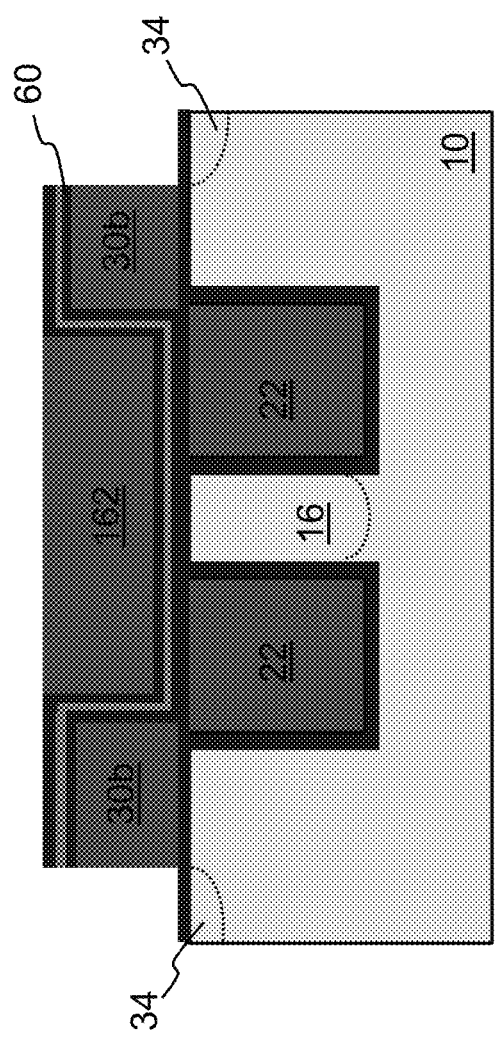

FIGS. 9A-9D illustrate the formation of another embodiment. The formation of this embodiment starts with the structure shown in FIG. 7B, but without the poly etch and implantation formation of the drain regions. Insulation layer 60 is then formed over the structure. This insulation layer can be a layer of single material, or could have multiple sub layers (e.g., ONO, which is oxide-nitride-oxide), as shown in FIG. 9A. Polysilicon 62 is then deposited over the structure, as shown in FIG. 9B. A poly etch is then performed to remove the portions of poly 162, leaving poly block 162 disposed over and insulated from the floating gates 22 and source region 16, and between and insulated from the word line gates 30b, as shown in FIG. 9C. A masking step and etch are used to remove portions of insulation layer 60 and poly blocks 30b, and an implant is then performed to form the drain regions 34, as shown in FIG. 9D. Poly block 162 constitutes an erase gate shared with both memory cells.

Figure 10A:
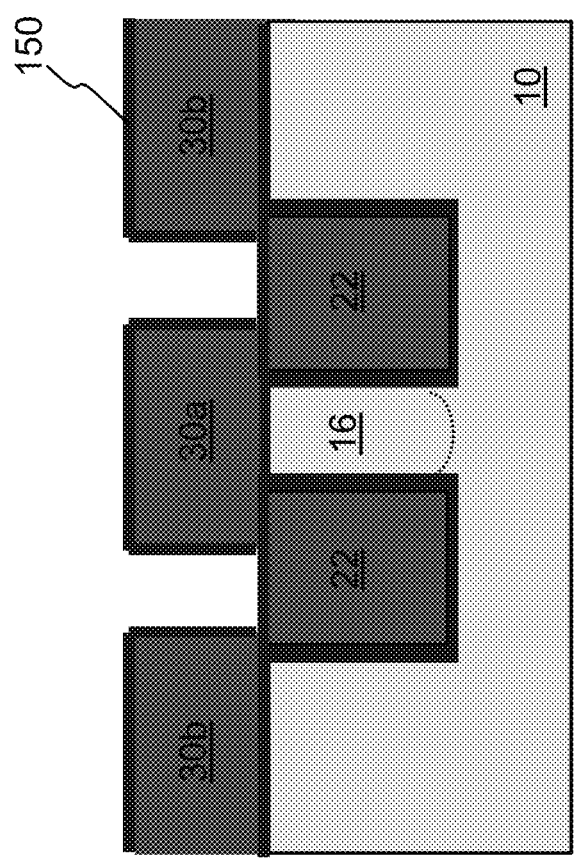
FIGS. 10A-10D are side cross sectional views illustrating the steps in forming the memory cells of a tenth embodiment of the present invention.
Figure 10B:
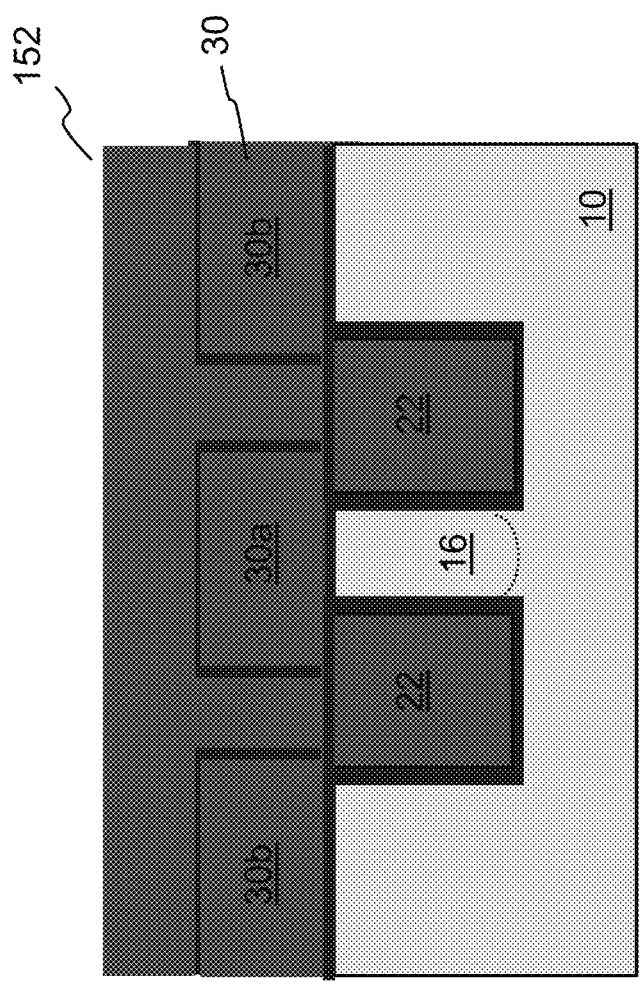
Figure 10C:
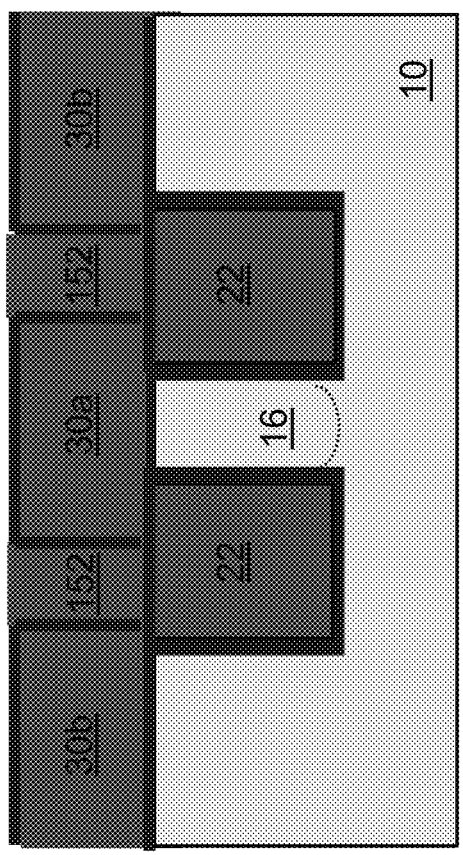
Figure 10D:
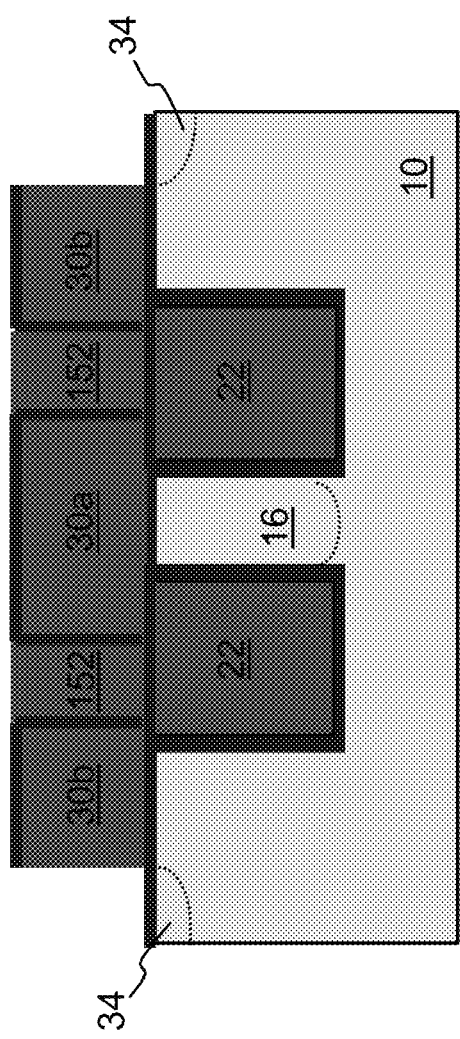

FIGS. 10A-10D illustrate the formation of another embodiment. The formation of this embodiment starts with the structure FIG. 8B, but without the poly etch and implantation formation of the drain regions. An insulation layer (e.g., oxide) 150 is formed on the structure, including the exposed tops and side surfaces of erase gate 30a and word line gates 30b, as shown in FIG. 10A. Polysilicon 152 is then deposited over the structure, as shown in FIG. 10B. A poly etch is then performed to remove the top portions of poly 152, leaving poly blocks 152 each of which is disposed over and insulated from one of the floating gates 22, and is disposed between and insulated from the erase gate 30a and one of the word line gates 30b, as shown in FIG. 10C. A masking step and etch are used to remove portions of insulation layer 150 and poly blocks 30b, and an implant is then performed to form the drain regions 34, as shown in FIG. 10D. Poly blocks 152 constitute control gates that can be used to better enhance the operation of the memory cells though capacitive coupling to the floating gates.

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the memory cell configurations of the present invention. Single layers of material could be formed as multiple layers of such or similar materials, and vice versa. Lastly, the terms "forming" and "formed" as used herein shall include material deposition, material growth, or any other technique in providing the material as disclosed or claimed.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A pair of memory cells, comprising:
   a semiconductor substrate having an upper surface;
   first and second trenches formed into the upper surface and spaced apart from each other;
   a first floating gate of conductive material disposed in the first trench and insulated from the substrate;
   a second floating gate of conductive material disposed in the second trench and insulated from the substrate;
   an erase gate of conductive material having a first portion extending into the upper surface, and disposed laterally between and insulated from the first and second floating gates;

a first word line gate of conductive material disposed over and insulated from a portion of the upper surface that is adjacent to the first floating gate;
a second word line gate of conductive material disposed over and insulated from a portion of the upper surface that is adjacent to the second floating gate;
a source region formed in the substrate laterally between the first and second floating gates and vertically under and insulated from the first portion of the erase gate;
a first drain region formed in a portion of the upper surface adjacent to the first word line gate;
a second drain region formed in a portion of the upper surface adjacent to the second word line gate;
wherein a first channel region of the substrate extends from the source region to the first drain region, including extending at least under the first trench, along a side wall of the first trench, and along a portion of the upper surface disposed under the first word line gate; and
wherein a second channel region of the substrate extends from the source region to the second drain region, including extending at least under the second trench, along a side wall of the second trench, and along a portion of the upper surface disposed under the second word line gate.

2. The pair of memory cells of claim 1, wherein the first trench only contains therein the first floating gate and insulation material that insulates the first floating gate from the substrate, and wherein the second trench only contains therein the second floating gate and insulation material that insulates the second floating gate from the substrate.

3. The pair of memory cells of claim 1, wherein the erase gate further comprises a second portion extending up and at least partially vertically over the first and second floating gates.

4. The pair of memory cells of claim 3, wherein each of the floating gates includes an upper surface with a notch formed therein, and wherein the lower portion of the erase gate extends into each of the notches.

5. The pair of memory cells of claim 3, further comprising:
a first control gate of conductive material disposed laterally between and insulated from the second portion of the erase gate and the first word line gate, and disposed vertically over and insulated from the first floating gate;
a second control gate of conductive material disposed laterally between and insulated from the second portion of the erase gate and the second word line gate, and disposed vertically over and insulated from the second floating gate.

6. The pair of memory cells of claim 1, further comprising:
a control gate of conductive material disposed laterally between and insulated from the first and second word line gates, and disposed vertically over and insulated from the erase gate and the first and second floating gates.

7. A pair of memory cells comprising:
a semiconductor substrate having an upper surface;
first and second trenches formed into the upper surface and spaced apart from each other;
a first floating gate of conductive material disposed in the first trench and insulated from the substrate;
a second floating gate of conductive material disposed in the second trench and insulated from the substrate;
a first word line gate of conductive material disposed over and insulated from a portion of the upper surface that is adjacent to the first floating gate;
a second word line gate of conductive material disposed over and insulated from a portion of the upper surface that is adjacent to the second floating gate;
a source region formed in the substrate laterally between the first and second floating gates;
a first drain region formed in a portion of the upper surface adjacent to the first word line gate;
a second drain region formed in a portion of the upper surface adjacent to the second word line gate;
wherein a first channel region of the substrate extends from the source region to the first drain region, including extending at least under the first trench, along a side wall of the first trench, and along a portion of the upper surface disposed under the first word line gate; and
wherein a second channel region of the substrate extends from the source region to the second drain region, including extending at least under the second trench, along a side wall of the second trench, and along a portion of the upper surface disposed under the second word line gate;
a first erase gate of conductive material disposed over and insulated from the first floating gate, wherein the first word line gate is laterally adjacent to and insulated from the first erase gate;
a second erase gate of conductive material disposed over and insulated from the second floating gate, wherein the second word line gate is laterally adjacent to and insulated from the second erase gate.

8. The pair of memory cells of claim 7, wherein the first trench only contains therein the first floating gate and insulation material that insulates the first floating gate from the substrate, and wherein the second trench only contains therein the second floating gate and insulation material that insulates the second floating gate from the substrate.

9. The pair of memory cells of claim 7, further comprising:
a block of conductive material disposed over and in electrical contact with the source region, and disposed laterally between and insulated from the first and second erase gates.

10. The pair of memory cells of claim 7, further comprising:
a block of conductive material disposed over and insulated from the source region, and disposed laterally between and insulated from the first and second erase gates.

11. A pair of memory cells comprising:
a semiconductor substrate having an upper surface;
first and second trenches formed into the upper surface and spaced apart from each other;
a first floating gate of conductive material disposed in the first trench and insulated from the substrate;
a second floating gate of conductive material disposed in the second trench and insulated from the substrate;
a first word line gate of conductive material disposed over and insulated from a portion of the upper surface that is adjacent to the first floating gate;
a second word line gate of conductive material disposed over and insulated from a portion of the upper surface that is adjacent to the second floating gate;
a source region formed in the substrate laterally between the first and second floating gates;
a first drain region formed in a portion of the upper surface adjacent to the first word line gate;
a second drain region formed in a portion of the upper surface adjacent to the second word line gate;

wherein a first channel region of the substrate extends from the source region to the first drain region, including extending at least under the first trench, along a side wall of the first trench, and along a portion of the upper surface disposed under the first word line gate; and wherein a second channel region of the substrate extends from the source region to the second drain region, including extending at least under the second trench, along a side wall of the second trench, and along a portion of the upper surface disposed under the second word line gate;

an erase gate of conductive material disposed over and insulated from the first and second floating gates and insulated from the substrate.

12. The pair of memory cells of claim 11, wherein the erase gate of conductive material is insulated from the first and second floating gates by an oxide, nitride, oxide layer.

13. The pair of memory cells of claim 11, further comprising:
a first control gate of conductive material disposed over and insulated from the first floating gate, and laterally between and insulated from the erase gate and the first word line gate;
a second control gate of conductive material disposed over and insulated from the second floating gate, and laterally between and insulated from the erase gate and the second word line gate.

14. A method of forming a pair of memory cells, comprising:
forming spaced apart first and second trenches into an upper surface of a semiconductor substrate;
forming a first floating gate of conductive material in the first trench and insulated from the substrate;
forming a second floating gate of conductive material in the second trench and insulated from the substrate;
forming an erase gate of conductive material having a first portion extending into the upper surface, and disposed laterally between and insulated from the first and second floating gates;
forming a first word line gate of conductive material over and insulated from a portion of the upper surface that is adjacent to the first floating gate;
forming a second word line gate of conductive material over and insulated from a portion of the upper surface that is adjacent to the second floating gate;
forming a source region in the substrate laterally between the first and second floating gates and vertically under and insulated from the first portion of the erase gate;
forming a first drain region in a portion of the upper surface adjacent to the first word line gate;
forming a second drain region in a portion of the upper surface adjacent to the second word line gate;
wherein a first channel region of the substrate extends from the source region to the first drain region, including extending at least under the first trench, along a side wall of the first trench, and along a portion of the upper surface disposed under the first word line gate; and
wherein a second channel region of the substrate extends from the source region to the second drain region, including extending at least under the second trench, along a side wall of the second trench, and along a portion of the upper surface disposed under the second word line gate.

15. The method of claim 14, wherein the first trench only contains therein the first floating gate and insulation material that insulates the first floating gate from the substrate, and wherein the second trench only contains therein the second floating gate and insulation material that insulates the second floating gate from the substrate.

16. The method of claim 14, wherein the erase gate further comprises a second portion extending up and at least partially vertically over the first and second floating gates, and wherein each of the floating gates includes an upper surface with a notch formed therein with the lower portion of the erase gate extending into each of the notches.

17. The method of claim 16, further comprising:
forming a first control gate of conductive material laterally between and insulated from the second portion of the erase gate and the first word line gate, and vertically over and insulated from the first floating gate;
forming a second control gate of conductive material laterally between and insulated from the second portion of the erase gate and the second word line gate, and vertically over and insulated from the second floating gate.

18. The method of claim 14, further comprising:
forming a control gate of conductive material laterally between and insulated from the first and second word line gates, and vertically over and insulated from the erase gate and the first and second floating gates.

19. A method of forming a pair of memory cells, comprising:
forming spaced apart first and second trenches into an upper surface of a semiconductor substrate;
forming a first floating gate of conductive material in the first trench and insulated from the substrate;
forming a second floating gate of conductive material in the second trench and insulated from the substrate;
forming a first word line gate of conductive material over and insulated from a portion of the upper surface that is adjacent to the first floating gate;
forming a second word line gate of conductive material over and insulated from a portion of the upper surface that is adjacent to the second floating gate;
forming a source region in the substrate laterally between the first and second floating gates;
forming a first drain region in a portion of the upper surface adjacent to the first word line gate;
forming a second drain region in a portion of the upper surface adjacent to the second word line gate;
wherein a first channel region of the substrate extends from the source region to the first drain region, including extending at least under the first trench, along a side wall of the first trench, and along a portion of the upper surface disposed under the first word line gate; and
wherein a second channel region of the substrate extends from the source region to the second drain region, including extending at least under the second trench, along a side wall of the second trench, and along a portion of the upper surface disposed under the second word line gate;
forming a first erase gate of conductive material over and insulated from the first floating gate, wherein the first word line gate is laterally adjacent to and insulated from the first erase gate;
forming a second erase gate of conductive material over and insulated from the second floating gate, wherein the second word line gate is laterally adjacent to and insulated from the second erase gate.

20. The method of claim 19, wherein the first trench only contains therein the first floating gate and insulation material that insulates the first floating gate from the substrate, and wherein the second trench only contains therein the second floating gate and insulation material that insulates the second floating gate from the substrate.

21. The method of claim 19, further comprising:
forming a block of conductive material over and in electrical contact with the source region, and laterally between and insulated from the first and second erase gates.

22. The method of claim 19, further comprising:
forming a block of conductive material over and insulated from the source region, and laterally between and insulated from the first and second erase gates.

23. A method of forming a pair of memory cells, comprising:
forming spaced apart first and second trenches into an upper surface of a semiconductor substrate;
forming a first floating gate of conductive material in the first trench and insulated from the substrate;
forming a second floating gate of conductive material in the second trench and insulated from the substrate;
forming a first word line gate of conductive material over and insulated from a portion of the upper surface that is adjacent to the first floating gate;
forming a second word line gate of conductive material over and insulated from a portion of the upper surface that is adjacent to the second floating gate;
forming a source region in the substrate laterally between the first and second floating gates;
forming a first drain region in a portion of the upper surface adjacent to the first word line gate;
forming a second drain region in a portion of the upper surface adjacent to the second word line gate;
wherein a first channel region of the substrate extends from the source region to the first drain region, including extending at least under the first trench, along a side wall of the first trench, and along a portion of the upper surface disposed under the first word line gate; and
wherein a second channel region of the substrate extends from the source region to the second drain region, including extending at least under the second trench, along a side wall of the second trench, and along a portion of the upper surface disposed under the second word line gate;
forming an erase gate of conductive material over and insulated from the first and second floating gates and insulated from the substrate.

24. The method of claim 23, wherein the erase gate of conductive material is insulated from the first and second floating gates by an oxide, nitride, oxide layer.

25. The method of claim 23, further comprising:
forming a first control gate of conductive material over and insulated from the first floating gate, and between and insulated from the erase gate and the first word line gate;
forming a second control gate of conductive material over and insulated from the second floating gate, and laterally between and insulated from the erase gate and the second word line gate.

* * * * *